(12) United States Patent
Sobiech et al.

(10) Patent No.: US 9,968,980 B2
(45) Date of Patent: May 15, 2018

(54) COATINGS FOR FORMING TOOLS

(71) Applicant: Oerlikon Surface Solutions AG, Trübbach, Trübbach (CH)

(72) Inventors: Matthias Lukas Sobiech, Wasserburg (DE); Hans-Werner Wulke, Jena (DE)

(73) Assignee: Oerlikon Surface Solutions AG, Pfäffikon, Pfäffikon (CH)

(*) Notice: Subject to any disclaimer, the term of this patent is extended or adjusted under 35 U.S.C. 154(b) by 19 days.

(21) Appl. No.: 14/906,192

(22) PCT Filed: Jul. 17, 2014

(86) PCT No.: PCT/EP2014/001952
§ 371 (c)(1),
(2) Date: Jan. 19, 2016

(87) PCT Pub. No.: WO2015/007391
PCT Pub. Date: Jan. 22, 2015

(65) Prior Publication Data
US 2016/0184877 A1    Jun. 30, 2016

Related U.S. Application Data

(60) Provisional application No. 61/856,226, filed on Jul. 19, 2013, provisional application No. 61/910,155, (Continued)

(30) Foreign Application Priority Data

Oct. 16, 2013 (EP) .................................... 13004958
Nov. 26, 2013 (EP) .................................... 13005498

(51) Int. Cl.
    C23C 14/06    (2006.01)
    B21D 37/01    (2006.01)
    (Continued)

(52) U.S. Cl.
    CPC .......... B21D 37/01 (2013.01); C23C 14/0057 (2013.01); C23C 14/025 (2013.01);
    (Continued)

(58) Field of Classification Search
    USPC .............. 204/192, 298.13, 192.15, 192.16; 428/408, 469, 698; 148/400; 420/485
    See application file for complete search history.

(56) References Cited

U.S. PATENT DOCUMENTS 4,992,153 A * 2/1991 Bergmann .......... C23C 14/0036
                                                      204/192.15
2004/0038033 A1* 2/2004 Massler ................ C23C 16/029
                                                      428/408
(Continued)

FOREIGN PATENT DOCUMENTS

WO    2011011129 A2    1/2011
WO    2012104048 A1    8/2012

OTHER PUBLICATIONS

Mo et al "Tribological investigation of WC/C coating under dry sliding conditions" Wear 271 (2011) p. 1998-2005.*
(Continued)

Primary Examiner — Archene Turner

(57) ABSTRACT

A hard coating comprising at least one hard layer with dedicated architectural design for attaining enhanced tribological performance (low abrasive and adhesive wear) at room and elevated temperatures in contact with Al-, Zn- and Fe-based or other counter bodies.

11 Claims, 30 Drawing Sheets

Related U.S. Application Data filed on Nov. 29, 2013, provisional application No. 61/938,375, filed on Feb. 11, 2014.

(51) Int. Cl.

| | | |
|---|---|---|
| *C23C 14/00* | (2006.01) | |
| *C23C 28/00* | (2006.01) | |
| *C23C 14/02* | (2006.01) | |
| *C23C 14/16* | (2006.01) | |
| *C23C 14/18* | (2006.01) | |
| *C23C 14/34* | (2006.01) | |

(52) U.S. Cl.
CPC ...... *C23C 14/0605* (2013.01); *C23C 14/0611* (2013.01); *C23C 14/0635* (2013.01); *C23C 14/165* (2013.01); *C23C 14/185* (2013.01); *C23C 14/34* (2013.01); *C23C 28/322* (2013.01); *C23C 28/343* (2013.01)

(56) References Cited

U.S. PATENT DOCUMENTS

| | | | | |
|---|---|---|---|---|
| 2008/0075625 | A1* | 3/2008 | Jabs | C23C 16/0272 420/485 |
| 2009/0202790 | A1* | 8/2009 | Eerden | C23C 28/00 204/298.16 |
| 2010/0012064 | A1* | 1/2010 | Lyo | F01L 1/143 148/218 |
| 2011/0094628 | A1* | 4/2011 | Mitsuda | C23C 14/027 148/400 |

OTHER PUBLICATIONS

Bewuilogua et al "Effect of traget material on depsition and properties of metal-containing DLC (Me-DLC) coaitngs" Surface & Techn 127 (2000) p. 224-232.*

Clarysse et al., "Tribological Properties of PVD Tool Coatings in Forming Operations of Steel Sheet," Wear, Elsevier, vol. 264, Jan. 2, 2008, pp. 400-404.

Gharam et al., "High Temperature Tribological Behaviour of Carbon Based (B4C and DLC) Coatings in Sliding contact with Aluminum," Thin Solid Films, Elsevier, vol. 519, Aug. 16, 2010, pp. 1611-1617.

"BALINIT Guarantees Superb Results in Punching and Forming," Oct. 4, 2010, XP055112233, URL:http://www.oerlikonbalzerscoating.com/bmx/documents/HQ043EN.pdf [retrieved Apr. 4, 2014], pp. 2, 7.

Bewilogua et al., "Structure, Properties and Applications of Diamond-Like Carbon Coatings Prepared by Reactive Magnetron Sputtering," Zeitschrift fur Metallkunde, vol. 96, 2005, pp. 998-1004.

Gies et al., "Influence of the Coating Structure of a-C:H:W Coatings on Their Wear-Performance: A Theoretical Approach and Its Practical Confirmation," Surface & Coatings Technology, Elsevier, vol. 237, Aug. 3, 2013, pp. 299-304.

Karbasian et al., "A Review on Hot Stamping," Journal of Materials Processing Technology, Elsevier, vol. 210, Jul. 19, 2010, pp. 2103-2118.

Norman et al., "Comparison of 22MNB5-Steel With and Without Alsi-Coating During Laser Hybrid Arc Welding," 13th NOLAMP Conference, Trondheim, Norway Jun. 27-29, 2011.

Wänstrand et al. "Mechanical and Tribological Evaluation of PVD WC/C Coatings," Surface & Coatings Technology, Elsevier, vol. 111, 1999, pp. 247-254.

E.E. Vera et al., "A Study of the Wear Performance of TiN, CrN and WC/C Coatings on Different Steel Substrates," Wear, Elsevier, vol. 271, Jul. 29, 2011, pp. 2116-2124.

B. Podgornik et al., "Influence of Surface Roughness and Coating Type on the Galling Properties of Coated Forming Tool Steel," Surface & Coatings Technology, Elsevier, vol. 184, Jun. 22, 2004, pp. 338-348.

P. Carlsson et al., "PVD Coatings for Sheet Metal Forming Processes—a Tribological Evaluation," Surface & coatings Technology, Elsevier, vol. 200, Apr. 10, 2006, pp. 4654-4663.

T. Senuma, "Physical Metallurgy of Modern High Strength Steel Sheets," ISIJ International, vol. 41, 2001, No. 6, pp. 520-532.

J. Pujante, "Wear Mechanism Identification on Hot Stamping Tools," 3rd International Conference Hot Sheet Metal Forming of High-Performance Steel CHS2, Friction & Wear & Lubrication, Kassel, Germany, 2011, pp. 377-384.

J. Kondratiuk et al., "Tribological Investigation on Friction and Wear Behaviour of Coatings for Hot Sheet Metal Forming," Wear, Elsevier, vol. 270, May 5, 2011, pp. 839-849.

Chinese Office Action for corresponding Chinese Application No. 201480040671.9, dated Feb. 21, 2017, and English translation.

Harald Hetzner et al., "Failure Mechanisms of a Tungsten-Modified Hydrogenated Amorphous Carbon Coating in Load-Scanning Tests," Surface & Coatings Technology, Sep. 17, 2012, pp. 46-54, vol. 212.

\* cited by examiner

Figure 1
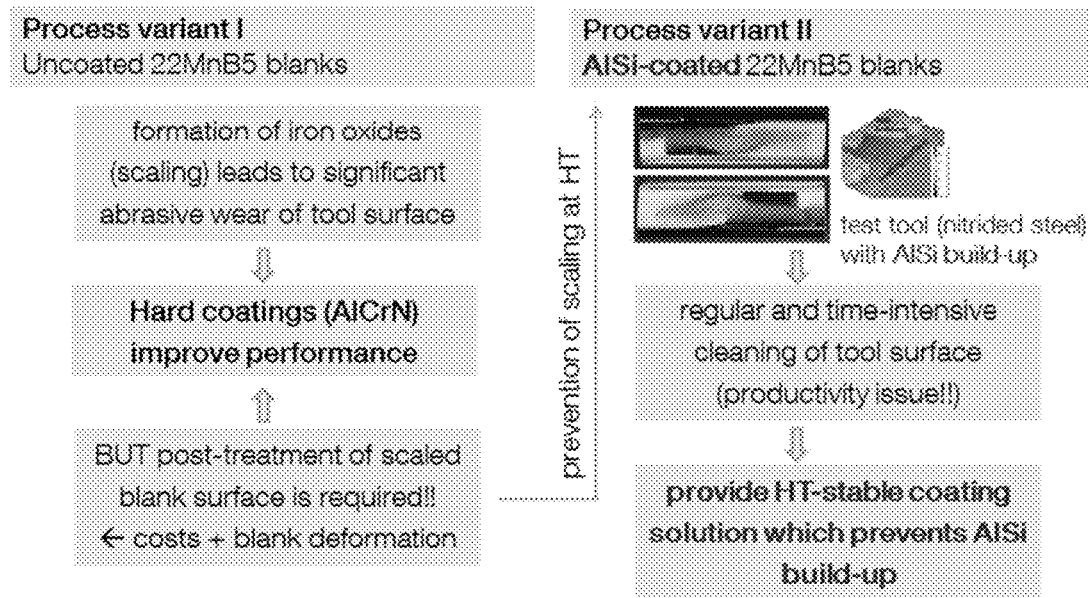
Figure 2
Characterization of MoC coating
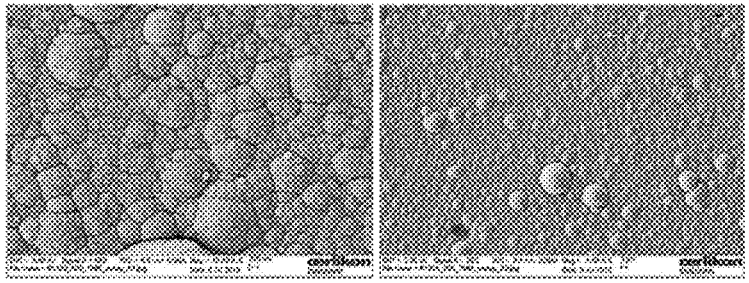
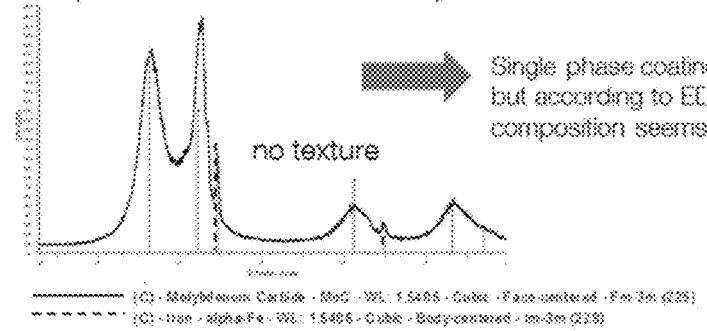
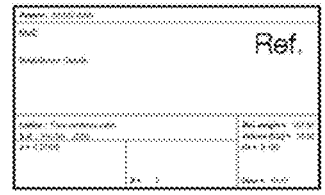

Figure 3
Characterization of MoC coating
SEM cross-section, as-deposited
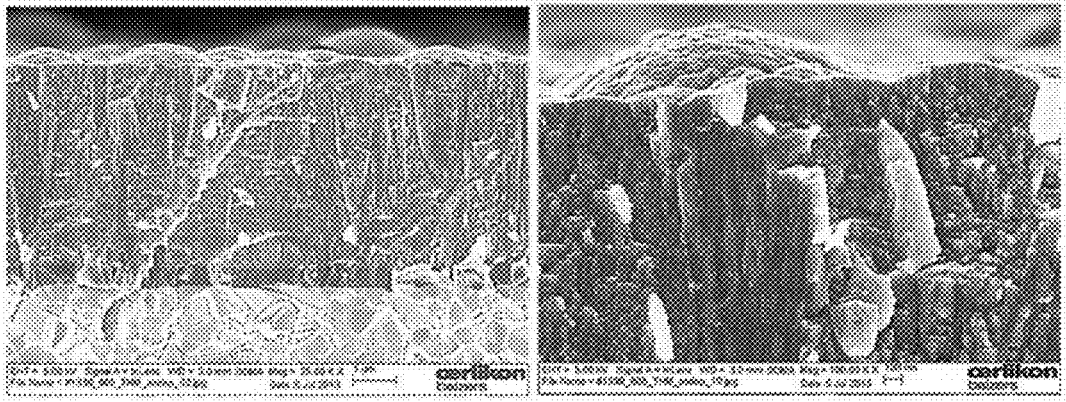
Coating thickness ~ 5 um
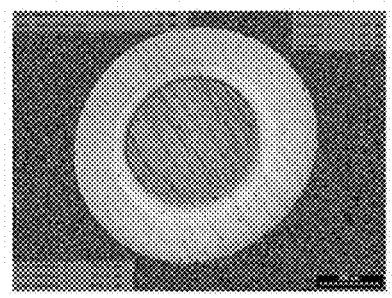
Other properties
Hardness        20 +/-1 GPa
E-modulus       207 +/- 8 GPa
COF             0.3
(Al2O3 at RT)
Figure 4
HT-SRV testing Coating vs. AlSi/22MnB5
Application-orientated internal HT-SRV-Testing at 800-500°C
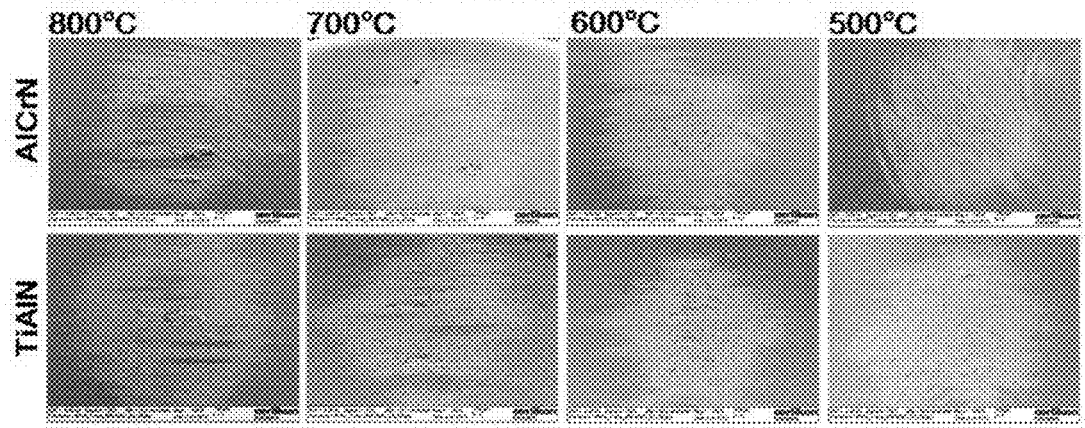

Figure 13

| x = metal blank temperature | HT-SRV-Testing x = 800°C, 2.5min | | HT-SRV-Testing x = 700°C, 2.5min | | HT-SRV-Testing x = 600°C, 2.5min | | HT-SRV-Testing x = 500°C, 2.5min | |
|---|---|---|---|---|---|---|---|---|
| | Abrasion | Adhesion | Abrasion | Adhesion | Abrasion | Adhesion | Abrasion | Adhesion |
| Nitrided-CL | 10% | 2.0 | 10% | 2.0 | 10% | 1.5 | 10% | 2.0 |
| AlCrN | 0% | 3.5 | 0% | 3.5 | 0% | 3.5 | 0% | 3.5 |
| TiAlN | 0% | 3.5 | 0% | 3.5 | 0% | 3.5 | 0% | 3.5 |
| MoN | 0% | 3.5 | 0% | 3.5 | 0% | 3.5 | 0% | 3.5 |
| CrSiC-150 | 5% | 1.25 | 10% | 1.25 | 15% | 1.25 | 35% | 1.25 |
| WSiC | - | - | - | - | 10% | 1.25 | - | - |
| MoC-200 | 0% | 1.25 | 0% | 1.25 | 0% | 1.25 | 0% | 1.25 |

Figure 14

| x = metal blank temperature | HT-SRV-Testing x = 600°C, 2.5min No. 1 | | HT-SRV-Testing x = 600°C, 2.5min No. 5 | | HT-SRV-Testing N x = 600°C, 2.5min | | HT-SRV-Testing x = 600°C, 2.5min No. 10 | |
|---|---|---|---|---|---|---|---|---|
| | Abrasion | Adhesion | Abrasion | Adhesion | Abrasion | Adhesion | Abrasion | Adhesion |
| AlCrN | 0% | 3.5 | 0% | 4.0 | 0% | 4.0 | 0% | 5.0 |
| CrSiC-150 | 15% | 1.25 | 40% | 1.5 | 40% | 1.5 | 100% | 2.5 |
| MoC-200 | 0% | 1.25 | 0% | 1.25 | 0% | 1.25 | 0% | 1.25 |
| MoC-300 | 0% | 1.0 | 0% | 1.0 | 0% | 1.0 | 0% | 1.0 |

Figure 15

| x = metal blank temperature | HT-SRV-Testing x = 600°C, 2.5min | | Abrasive wear coefficient at RT [m³·m⁻¹·N⁻¹·10⁻¹⁵] | Coating hardness GPa | Coefficient of friction | | Oxidation at 600°C for 1h in ambient atmosphere |
|---|---|---|---|---|---|---|---|
| | Abrasion | Adhesion | | | (at RT) Al₂O₃ | (at 600°C) AlSi sheet | |
| Nitrided-CL | 10% | 1.5 | 27.0 | 10 +/- 0.7 | 0.8 | 1.4 | 30% |
| AlCrN | 0% | 3.5 | 1.6 | 39 +/- 5 | 0.6 | 1.2 | 0% |
| TiAlN | 0% | 3.5 | 4.1 | 34 +/- 2 | 0.7 | 1.2 | 0% |
| MoN | 0% | 3.5 | 8.0 | 30 +/- 3 | 0.4 | 1.2 | 100% |
| CrSiC-150 | 15% | 1.25 | 10.0 | 20 +/- 1.4 | 0.3 | 1.1 | <<5% (800°C,1h) |
| WSiC | 10% | 1.25 | - | - | - | 0.6 | - |
| MoC-100 | 0% | 2.5 | 15.3 | 29 +/- 2 | 0.5 | 1.4 | - |
| MoC-200 | 0% | 1.25 | 9.0 | 20 +/- 1.1 | 0.3 | 1.0 | 30% |
| MoC-250 | 0% | 1.25 | 6.0 | 15 +/- 1 | 0.25 | 0.6 | - |
| MoC-300 | 0% | 1.0 | 6.0 | 14 +/- 1 | 0.2 | 0.5 | 15% |
| MoCrSiC-200 | 5% | 1.25 | 9.5 | 13 +/- 1 | 0.3 | 0.7 | 5% |
| MoCrSiC-300 | 25% | 1.0 | 27.4 | 7 +/- 0.5 | 0.25 | 0.8 | 5% |
| MoC/MoCrSiC-200 | 0% | 1.25 | 6.6 | 18 +/- 1 | 0.25 | 0.9 | <5% |

Figure 16

| x = metal blank temperature | HT-SRV-Testing x = 700°C, 2.5min | | Abrasive wear coefficient at RT | Coating hardness | Coefficient of friction | | Oxidation at 600°C for 1h in ambient atmosphere |
|---|---|---|---|---|---|---|---|
| | Abrasion | Adhesion | [m³m⁻¹N⁻¹10⁻¹⁵] | GPa | (at RT) Al₂O₃ | (at 700°C) Zn/sheet | |
| Nitrided-CL | >5% | 3.0 | 27.0 | 10 +/- 0.7 | 0.8 | 1.4 | 30% |
| AlCrN | 0% | 3.0 | 1.6 | 39 +/- 5 | 0.6 | 1.4 | 0% |
| TiAlN | 0% | 3.0 | 4.1 | 34 +/- 2 | 0.7 | 1.4 | 0% |
| MoN | 0% | 1.5 | 8.0 | 30 +/- 3 | 0.4 | 1.0 | 100% |
| CrSiC-150 | 10% | 2.0 | 10.0 | 20 +/- 1.4 | 0.3 | 1.2 | <5% (800°C,1h) |
| MoC-200 | 5% | 1.5 | 9.0 | 20 +/- 1.1 | 0.3 | 0.6 | 30% |
| MoC-300 | 0% | 1.25 | 6.0 | 14 +/- 1 | 0.2 | 0.5 | 15% |
| | HT-SRV-Testing x = 700°C, 10 x 2.5min | | | | | | |
| | Abrasion | Adhesion | | | | | |
| Nitrided-CL | 15% | 3.0 | 27.0 | 10 +/- 0.7 | 0.8 | 1.4 | 30% |
| MoN | 0% | 1.5 | 8.0 | 30 +/- 3 | 0.4 | 1.0 | 100% |
| MoC-300 | 0% | 1.25 | 6.0 | 14 +/- 1 | 0.2 | 0.5 | 15% |

Figure 24
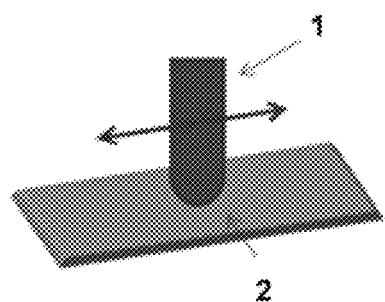
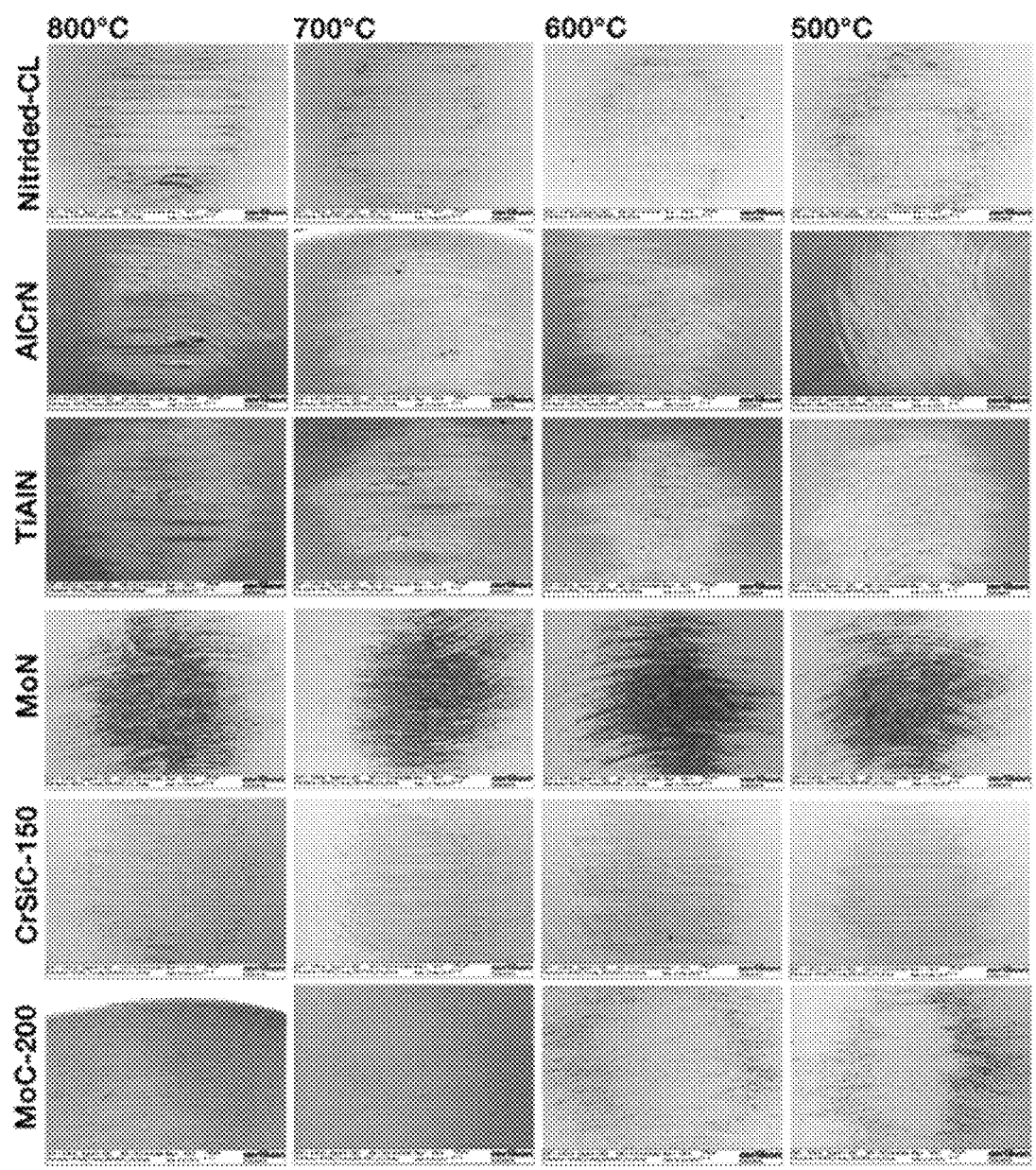
Figure 25

Figure 35:

| | | | | | | | | |
|---|---|---|---|---|---|---|---|---|
| AlCrN | 0% | 3.5 | 0% | 3.5 | 0% | 3.5 | 0% | 3.5 |
| TiAlN | 0% | 3.5 | 0% | 3.5 | 0% | 3.5 | 0% | 3.5 |
| Mo | - | 2.0 | - | 2.25 | - | 2.5 | - | 2.5 |
| MoCuN | - | 2.5 | - | 3.0 | - | 3.0 | - | 3.0 |
| CrSiC | 5% | 1.25 | 10% | 1.25 | 15% | 1.25 | 35% | 1.25 |
| WSiC | - | - | - | - | 10% | 1.25 | - | - |
| MoC | 0% | 1.25 | 0% | 1.25 | 0% | 1.25 | 0% | 1.25 | adhesive wear: 1 best and 5 worst abrasive wear: coating loss in %

Figure 36:

| | Coating thickness in µm | Abrasive wear coefficient at RT [m$^3$m$^{-1}$N$^{-1}$10$^{-15}$] | Coating hardness GPa | Coefficient of friction Al$_2$O$_3$ at RT | Oxidation at 600°C for 1h in ambient atmosphere |
|---|---|---|---|---|---|
| Nitrided CL | ~ 10 µm (CL) | 27.0 | 10 +/- 0.7 | 0.8 | 30% |
| AlCrN | ~ 3 µm | 1.6 | 39 +/- 5 | 0.6 | 0% |
| a-C:H:W | ~ 3 µm | 3.5 | 15 +/- 2 | 0.1 | 5% |

Figure 37:

| x = metal blank temperature | HT-SRV-Testing x = 600°C, 1 x 2.5min Abrasion | Adhesion | HT-SRV-Testing x = 600°C, 10 x 2.5min Abrasion | Adhesion | COF at 600°C vs. sheet |
|---|---|---|---|---|---|
| Nitrided-CL | 10% | 1.5 | 20% | 2.5 | 1.4 |
| AlCrN | 0% | 3.5 | 0% | 5.0 | 1.2 |
| a-C:H:W | 0% | 1.25 | 20% | 1.25 | 0.3 |

Figure 38:

| x = metal blank temperature | HT-SRV-Testing x = 700°C, 1 x 2.5min Abrasion   Adhesion | HT-SRV-Testing x = 700°C, 10 x 2.5min Abrasion   Adhesion | COF at 700°C vs. sheet |
|---|---|---|---|
| Nitrided-CL | 0%s         3.0 | 15%         3.0 | 1.4 |
| AlCrN | 0%          3.0 | 0%          3.5 | 1.4 |
| a-C:H:W | 0%          1.0 | 0%          1.0 | 0.6 |

COATINGS FOR FORMING TOOLS

FIELD OF THE INVENTION

This invention is related to coatings for forming tools. For forming tools, be it warm or hot stamping or any other forming, problems especially arise when the substrates to be formed are coated themselves. The present invention deals with several aspects of such or related problems. Accordingly different aspects and the solutions are described in the following.

BACKGROUND OF THE INVENTION

First Aspect of Invention: Hot Stamping

The continuously increasing requirements in automotive industry regarding light weight construction and improvement of passenger safety can be achieved successfully by the hot stamping approach, where AlSi coated ultra-high strength steels (UHSS; 22MnB5) are nowadays commonly used for production of structural parts (e.g. b-pillar). The AlSi topcoat provides protection against blank oxidation during the heat treatment (austenitization) at about 930° C. in ambient atmosphere, enables enhanced lubrication between tool and metal blank surface during the forming process and finally acts as passive corrosion barrier once the component is part of the vehicle chassis. Unfortunately, the AlSi topcoat exhibits a strong tendency to build-up on the tool steel surface upon forming operation at high temperatures which leads to significant adhesive wear. In order to increase productivity by avoiding time-consuming tool maintenance periods, a high temperature stable PVD coating solution with low build-up tendency for AlSi is required by automotive industry. For hot stamping applications TiAlN and AlCrN coatings are currently used. These material systems are characterized by excellent high temperature properties like adhesion strength, hardness, structural stability and oxidation resistance. Unfortunately both material systems exhibit a significant AlSi build-up tendency.

Hot Stamping Coating Requirements According to First Aspect

High temperature stable PVD coating solution which prevents effectively AlSi build-up upon long-term operation Long-term performance at T~800° C.!!
Structural stability
Chemical stability
Oxidation resistance
Resistance against thermo-mechanical fatigue
Resistance against thermal shocking
Hot hardness
Abrasive wear resistance
Long-term resistance against AlSi build-up It is an objective of the present invention to disclose a coating for stamping tools which provides for low abrasive and low adhesive wear during hot stamping of AlSi-coated metal blanks.

Second Aspect of Invention: Coated Warm or Hot Forming Tools with Enhanced Performance The second aspect of the invention relates to a warm or hot forming tool coated with a hard coating comprising at least one a-C:H:W hard layer for attaining enhanced tool life time and performance.

State of the Art

In recent years hot stamping of ultra-high strength steel sheets (as e.g. 22MnB5) is used more and more for manufacturing of automobile components (as e.g. B-pillar) with reduced weight in order to decrease on the one hand $CO_2$ emission but also to improve on the other hand simultaneously passenger safety. Thus structural components (as e.g. B-pillar) made of the ultra-high strength steel sheets can be made significantly lighter by simply reducing the sheet thickness. For these reasons, the application of hot stamping or hot sheet metal forming processes for manufacturing of new structural automobile components has increased considerably in recent years and therefore it is necessary to bring into focus the complications which have arisen in parallel as well.

In Europe for example a hot metal sheet forming method called die quenching, hot forming, hot stamping or hot pressing is employed for fabricating automobile structural components having a tensile strength of around 1500 MPa (after processing). By this method the pre-heated (up to about 950° C. for homogeneous austenitization) ultra-high strength steel sheets can be easily formed and hardened in one stroke upon closing the forming press. The process can be described as follows: A heated ultra-high strength steel sheet is extracted from a heating furnace, then transferred within a few seconds to a pressing machine, subsequently formed into a prescribed shape using dedicated hot metal sheet forming tools which are maintained at room temperature and thus by quenching the ultra-high strength steel sheets during forming it can be hardened by the phase transformation from austenite to martensite exhibiting finally a tensile strength of about 1500 MPa. The press is kept closed for several seconds until the martensite transformation is completed (Senuma, T.: ISIJ Int. 41, 520 (2001)).

Generally speaking, as the tensile strength of a steel sheet increases, its formability and ductility decreases. Therefore, to overcome these limitations, various types of ultra-high strength steel sheet products have been developed and are still a matter of on-going research (Senuma, T.: ISIJ Int. 41, 520 (2001); 8. Erlanger Workshop Warmblechumformung Nov. 12, 2013).

In order to protect the steel sheet surface from uncontrolled oxidation (i.e. scale formation) during heating up to about 950° C. in ambient atmosphere, protective top-coats are frequently employed as e.g. AlSi- or Zn-based coatings (J. Kondratiuk et al. Wear 270 (2011) 839). For this purpose aluminized steel sheets such as the so-called USIBOR 1500 (AlSi-coated) as well as different kinds of metal sheets coated with zinc based coatings have been developed. These metal sheet variants exhibit generally excellent hot-pressing properties and corrosion resistance quality.

However, in spite of the very promising properties exhibited by the coated (AlSi and Zn) metal sheet versions as mentioned above, there are serious process complications which can be described as follows: Both sheet coating materials (AlSi and Zn) exhibit at high temperatures very pronounced tendency to adhere (stick) onto the forming tool surface. After several successive forming cycles the adhered and accumulated material may result in scratches and eventually cracks (this problem is often called galling) on the surface of the formed products (e.g. B-pillar) and therefore may also result in reduced or unsatisfactory product quality. Furthermore, massive sticking of material onto the forming tool surface leads to frequent maintenance periods (cleaning of tool surface) in production environment which reduces productivity enormously. Moreover, oxidation of AlSi and Zn leads to formation of abrasive oxide phases. Thus, in direct contact with the tool surface and upon long-term operation abrasive wear becomes more and more relevant. Additionally, with particular relevance for Zn-coated metal sheets, the formation of micro-cracks upon forming is also of paramount significance with respect to corrosion performance.

In order to overcome these complications it has already been speculated that process lubrication might be useful to suppress galling for AlSi-coated and Zn-coated sheets but also to reduce the degree of micro-cracking, in particular for Zn-coated sheets. However, from an industrial point of view efficient process lubrication by solid or liquid agents is not possible as it would deteriorate massively the workshop environment and upon post-treatment of the formed parts unhealthy degreasing agents would be needed in order to remove the remnants of the lubricant from the surface of the formed parts.

In WO2012104048 it is mentioned that one concept for improving current performance by hot metal sheet forming processes using coated metal sheets is to apply a low friction/high wear resistant PVD coating on the hot metal sheet forming tool. Furthermore, WO2012104048 cited the results obtained by Clarysse et al (Clarysse, F. et al. Wear 264 (2008) 400-404) in the context of some investigations about the behavior of different coating systems in tests especially designed to assess the response of the coatings to galling. They reported that carbon-based composite layers such as DLC-type (DLC is a well-known abbreviation for referring to amorphous diamond like carbon coatings which can be also referred as a-C:H coatings if they contain beside carbon only hydrogen without any further elements) and WC/C (a WC/C coating is a a-C:H:W coating in the context of the present invention) perform outstanding regarding galling resistance and they recommended therefore to use this type of tool coatings instead of typical hard coatings like for example CrN, TiN and CrN/TiCrN for avoiding galling.

For better understanding of the state of the art, it is important to emphasize that the temperature at which Clarysse et al. performed the tests was not specified. However, according to the description of the experiments it is straightforward to conclude that the intention of Clarysse et al. was to investigate the behaviour of coatings with respect to cold metal sheet forming operations and not with respect to hot metal sheet forming operations.

The authors of WO2012104048 reported that the improved performance for cold metal sheet forming tools obtained by using the coatings proposed by Clarysse et al. is not given sufficiently for hot sheet metal forming processes of coated ultra-high strength metal sheets.

Furthermore, it is reported in WO2012104048 that when AlSi-coated ultra-high strength steel sheets like USIBOR 1500 are used, the galling phenomenon cannot be satisfactorily reduced and because of that galling wear continues being a problem. Additionally, the authors of WO2012104048 recommended using CrSiN coatings for avoiding galling of hot metal sheet forming tools.

Moreover, the use of nitriding and carbonitriding processes, as well as other kinds of surface treatments, such as plasma treatments and micro-structuring, is mentioned in WO2012104048 as an alternative for improving performance of hot metal sheet forming tools.

Likewise, in WO2011011129 it is mentioned that coatings which normally perform well in cold forming conditions tend to yield poor performance under warm and hot forming operations or under high contact loading conditions. The authors of WO2011011129 supposed that the low performance of the coatings in these situations can be attributed to the inability of the coating to withstand cyclic thermo-mechanical or high contact loading applications faced for example, in warm and hot forming applications. They explain that in warm and hot metal forming processes, the tooling is exposed to thermo-mechanical conditions and therefore experiences a high thermal gradient through the thickness of the tool for example. In addition, the surface of the tooling is also subjected to cyclic thermal loading and compressive-tensile stress cycles. Consequently, the thermo-mechanical load cycle of tooling in warm and hot forming operations is also significantly different than that of tooling in cold forming operations. Additionally, WO2011011129 proposed a coating which should be able to provide improved wear life as well as oxidation resistance properties for forming tools used in thermo-mechanical load applications comprising for example $TiC_xN_{(1-x)}$ or $TiMC_xN_{(1-x)}$, with M: Al or a transition element from Groups 4, 5 and 6 of the periodic table, as a bottom coating and having a top coating including for example alumina or aluminium containing phases.

Objective of the Invention

It is an objective of the present invention, to provide a warm or hot forming tool having improved lifetime and satisfactory performance in warm or hot forming operations, particularly in warm or hot metal sheet forming of coated metal sheets, in particular of metal sheets coated with AlSi- and Zn-based coatings.

Third Aspect of Invention: Coatings for Tribological Applications at Room and Elevated Temperatures The third aspect of the invention relates to a hard coating comprising at least one Mo—C (molybdenum carbide) hard layer with dedicated architectural design for attaining enhanced tribological performance (low abrasive and adhesive wear) at room and elevated temperatures in contact with Al-, Zn- and Fe-based counter bodies.

State of the Art

The development and application of new technologies for industrial production (e.g. cutting or forming of steel for production of automotive body parts) as well as for subsequent consumer applications (e.g. use of automobiles for private issues) involves always unavoidably the necessity to be concerned with new and challenging tribological systems at room and elevated temperatures in contact with different counter body materials. Even though the development of new technologies might be theoretically possible, they can only be implemented practically in our daily live with success once the tribological systems involved are designed such that productivity and efficiency are not limited by wear. Against this background it follows straightforwardly that tribology and wear are of paramount importance for the industrial but also for our societal environment and thus the control of material wear is and will remain one major goal of our technological development. In particular at non-ambient temperatures it is mandatory to ensure the functionality of the surfaces (e.g. parts, components, tools, etc.) involved with respect to mechanical, structural and chemical stability. To this end hard coatings are often employed. However, it is still a great challenge to provide hard coatings with enhanced tribological properties for high temperature applications in order to reduce both simultaneously, abrasive and adhesive wear, but without losing mechanical, structural and chemical performance.

One proper example therefor is the "hot stamping" or "press hardening" technology developed some years ago with the goal to provide low-weight ultra-high strength steels (as e.g. 22MnB5) for manufacturing of automobiles with reduced CO2 emission. Thus structural components (as e.g. B-pillar) made of the ultra-high strength steel sheets can be made significantly lighter by simply reducing the sheet thickness but without losing mechanical performance which is important for passenger safety issues. For these reasons, the application of hot stamping processes for manufacturing of new structural automobile components has increased considerably in recent years, but on the other hand process complications like significant tool wear and other tribological phenomena arised in parallel as well which makes it currently absolutely mandatory to focus on these topics. In the following first a more detailed understanding of the hot stamping technology will be given before the process complications mentioned above can be described in the right context.

In Europe for example a hot metal sheet forming method called die quenching, hot forming, hot stamping or hot pressing is employed for fabricating automobile structural components having a tensile strength of around 1500 MPa (after processing). By this method the pre-heated (up to about 950° C. for homogeneous austenitization) ultra-high strength steel sheets can be easily formed and hardened in one stroke upon closing the forming press. The whole process can be described as follows: A heated ultra-high strength steel sheet is extracted from a heating furnace, then transferred within a few seconds to a pressing machine, subsequently formed into a prescribed shape using dedicated hot metal sheet forming tools which are maintained at room temperature and thus by quenching the ultra-high strength steel sheets during forming the steel sheet can be hardened by the phase transformation from austenite to martensite exhibiting finally a tensile strength of about 1500 MPa. The press is kept closed for several seconds until the martensite transformation is completed.

In order to protect the steel sheet surface from uncontrolled oxidation (i.e. scale formation) during heating up to about 950° C. in ambient atmosphere, protective top-coats are frequently employed as e.g. AlSi- or Zn-based coatings. For this purpose aluminized steel sheets such as the so-called USIBOR 1500 (AlSi-coated) as well as different kinds of metal sheets coated with Zn-based coatings have been developed. These metal sheet variants exhibit in general excellent hot stamping properties and good corrosion resistance.

However, in spite of the very promising properties exhibited by the coated (AlSi- and Zn-based) metal sheet versions as mentioned above, there are serious process complications (related to tool wear and other tribological phenomena at the tool/sheet interface) which can be described as follows:

Both sheet coating materials (AlSi and Zn) exhibit at high temperatures very pronounced tendency to adhere (stick) onto the forming tool surface; see also FIG. 17. After several successive forming cycles the adhered and accumulated material (this phenomena is often called galling) may result in scratches and eventually cracks on the surface of the formed products (e.g. B-pillar) and therefore may also result in reduced or unsatisfactory product quality.

Furthermore, massive sticking of (AlSi- or Zn-based) material onto the forming tool surface leads to frequent maintenance periods (cleaning of tool surface) in production environment which reduces productivity enormously.

Moreover, oxidation of AlSi- and Zn-based coatings leads to formation of abrasive oxide phases. Thus, in direct contact with the tool surface and upon long-term operation abrasive wear becomes more and more relevant.

Additionally (and with particular relevance for Zn-coated metal sheets) the formation of micro-cracks within the coating/substrate system upon forming is also of paramount significance with respect to corrosion performance; see also FIG. 17.

In order to overcome these process complications occurring at the tool/sheet interface at high temperatures, it has already been speculated that process lubrication might be useful to suppress galling for AlSi- and Zn-coated sheets but also to reduce the degree of micro-cracking, in particular for Zn-coated sheets. However, from an industrial point of view efficient process lubrication by solid or liquid agents is not possible as it would deteriorate massively the workshop environment and upon post-treatment of the formed parts unhealthy degreasing agents would be needed in order to remove the remnants of the lubricant from the surface of the formed parts.

In WO2012104048 it is mentioned that one concept for improving tool performance during hot stamping of coated metal sheets is to apply generally a low friction/high wear resistant PVD coating on the forming tool.

From literature it is known that carbon-based composite layers such as DLC (DLC is a well-known abbreviation for amorphous diamond like carbon coatings also written as a-C:H if the coating contains beside carbon only hydrogen without any further elements) and WC/C (a WC/C coating is an a-C:H:W coating, i.e. a DLC coating with W) perform outstanding regarding galling resistance upon cold metal sheet forming operations and therefore it is recommended to use this type of tool coatings instead of typical hard coatings like for example CrN, TiN and CrN/TiCrN for avoiding galling.

However, sound statements including experimental results about performance of such carbon-based coatings at high temperatures are still not available. In WO2011011129 it is also only generally stated that coatings which normally perform good in cold forming operations tend to yield poor performance under hot forming operations and/or under high contact loading conditions. The authors supposed that this behavior is attributed to the inability of the coatings to withstand cyclic thermo-mechanical loading conditions during hot forming applications. Their proposal is to use for such applications $TiC_xN(1-x)$ or $TiMC_xN(1-x)$ (with M: Al or a transition element from groups 4, 5 and 6 of the periodic table) as a bottom coating and e.g. alumina or aluminium containing phases as top coating in order to account for oxidation and wear resistance as well.

A further concept to improve tool performance during hot stamping of coated metal sheets is the use of nitriding and carbonitriding processes and other kinds of surface treatments as well, such as plasma treatments and micro-structuring, as mentioned in WO2012104048. However, the authors recommended using CrSiN coatings for avoiding galling of hot metal sheet forming tools.

However, the application of the above mentioned tool surface concepts does still not provide sufficient improvement in tool performance during hot stamping of coated metal sheets. In particular for AlSi- and Zn-coated ultra-high strength steel sheets (e.g. 22MnB5) the galling phenomena and the micro-cracking issue (with particular relevance for Zn-coated 22MnB5) remain a problem of highest priority.

Objective of the Invention

Against the above background it is an objective of the present invention to provide a hard coating for attaining enhanced tribological performance (low abrasive and adhesive wear) at room and elevated temperatures in contact with Al-, Zn- and Fe-based counter bodies.

SUMMARY OF THE INVENTION

Object and Solution According to First Aspect of the Invention

According to the present invention metal carbide coatings are used as functional layers of the coating for stamping tools.

According to a preferred embodiment of the present invention, the carbon concentration within the coating exceeds the stoichiometric concentration.

According to an embodiment of the invention the metallic element is molybdenum.

According to another embodiment of the invention the metallic part comprises Cr and Si.

According to another embodiment of the invention the metallic part comprises W and Si.

According to another embodiment of the invention an adhesion layer system comprised of at least one layer is provided between the functional layer and the substrate.

According to another embodiment of the invention the adhesion layer system is comprised of a Me1N layer, followed by an Me1Me2N layer, followed by an Me1Me2NC layer, where Me2C are the elements used for the functional layer.

Summary According to Second Aspect of the Invention

The present invention also relates to a warm or hot forming tool coated with a hard coating.

A warm or hot forming tool according to the present invention has a substrate and a hard coating, wherein the coating comprises at least one a-C:H:W hard layer.

A warm or hot forming tool according to the present invention can be in particular a warm or hot metal sheet forming tool.

According to a preferred embodiment of the present invention the at least one a-C:H:W hard layer is deposited as outermost layer.

According to another preferred embodiment of the present invention the at least one a-C:H:W hard layer is deposited as functional layer.

At least one interlayer can be deposited between the substrate and the hard coating for improving the adhesion of the hard coating to the substrate, for example a chromium layer.

A tool according to the aforementioned embodiments of the present invention can be used in hot sheet metal forming processes for manufacturing a work piece.

According to the present invention the work piece can be a metal sheet coated with a Zn-based or an AlSi-based coating.

According to the present invention the work piece can be an ultra-high strength metal sheet able to exhibit a tensile strength of around 1500 MPa or more after appropriate hot stamping.

Solution According to Third Aspect of the Invention

According to the invention, the objective of providing a hard coating for attaining enhanced tribological performance (low abrasive and adhesive wear) at room and elevated temperatures in contact with Al-, Zn- and Fe-based counter bodies is achieved by a hard coating comprising at least one Mo—C(molybdenum carbide) hard layer. According to one preferable embodiment it has a dedicated architectural design.

With such a hard coating comprising at least one Mo—C (molybdenum carbide) hard layer for attaining enhanced tribological performance (low abrasive wear and significantly reduced galling) the tool performance during hot stamping of AlSi- and Zn-coated ultra-high strength steel sheets (e.g. 22MnB5) can be increased significantly.

BRIEF DESCRIPTION OF THE DRAWINGS

FIG. 1 shows process variants of coated and uncoated blanks.

FIGS. 2 and 3 show characterizations of MoC coating.

FIGS. 4 and 5 show the results of IT-SRV testing Coating vs. AlSi/22MnB5.

FIG. 13: Results obtained for the tribosystem coating vs. AlSi-based/22MnB5 after HT-SRV testing for 2.5 min and for different metal blank temperatures (800-500° C.). Adhesive wear of coating: 1 best and 5 worst; abrasive wear of coating: coating loss in % normalized to 8 μm. The numbers in the coating notation indicate the C2H2 flow in sccm. The corresponding SEM wear track micrographs are shown in FIG. 25.

FIG. 14: Results obtained for the tribosystem coating vs. AlSi-based/22MnB5 after HT-SRV testing for 2.5 min at 600° C. and for repeating the test up to 10 times in succession. Adhesive wear of coating: 1 best and 5 worst; abrasive wear of coating: coating loss in % normalized to 8 μm. The numbers in the coating notation indicate the C2H2 flow in sccm. The schematic illustration of the wear evolution and the corresponding SEM wear track micrographs are shown in FIGS. 26 and 27, respectively.

FIG. 15: Summary of relevant coating properties for the tribosystem coating vs. AlSi-based/22MnB5: HT-SRV testing for 2.5 min at 600° C. (adhesive wear: 1 best and 5 worst; abrasive wear: coating loss in % normalized to 8 μm), abrasive wear coefficient at RT, hardness, coefficient of friction and oxidation behavior (oxide layer thickness as measured in cross-sectional SEM analyses in % normalized to a coating thickness of 8 μm). The numbers in the coating notation indicate the C2H2 flow in sccm. The corresponding SEM wear track micrographs are shown in FIG. 28.

FIG. 16: Summary of relevant coating properties for the tribosystem coating vs. Zn-based/22MnB5: HT-SRV testing for 2.5 min and 10×2.5 min at 700° C. (adhesive wear: 1 best and 5 worst; abrasive wear: coating loss in % normalized to 8 μm), abrasive wear coefficient at RT, hardness, coefficient of friction and oxidation behavior (oxide layer thickness as measured in cross-sectional SEM analyses in % normalized to a coating thickness of 8 µm). The numbers in the coating notation indicate the C2H2 flow in sccm. The corresponding SEM wear track micrographs are shown in FIG. 29.

FIG. 24: HT-SRV test setup for tribological testing at non-ambient temperatures: The coated SRV pins (1) will be loaded and subsequently stroked against the (AlSi and Zn) coated metal sheet (2) at elevated temperatures.

FIG. 25: SEM micrographs of the wear tracks on the coating surface for the tribosystem coating vs. AlSi-based/22MnB5 after HT-SRV testing for 2.5 min and for different metal blank temperatures (800-500° C.). Build-up material is AlSi-based. The numbers in the coating notation indicate the C2H2 flow in sccm. See also FIG. 13.

FIG. 35: Results of SRV testing.

FIG. 36: Summary of particularly relevant coating properties.

FIG. 37: Results obtained after HT-SRV testing for the tribosystem involving coating vs. AlSi/22MnB5. Adhesive wear: 1 best and 5 worst; Abrasive wear: coating loss in % normalized to 8 µm.

FIG. 38: Results obtained after HT-SRV testing for the tribosystem involving coating vs. Zn-based/22MnB5. The coefficient of friction was measured as well. Adhesive wear: 1 best and 5 worst; Abrasive wear: coating loss in % normalized to 8 µm.

DETAILED DESCRIPTION OF THE INVENTION

Figure 5:
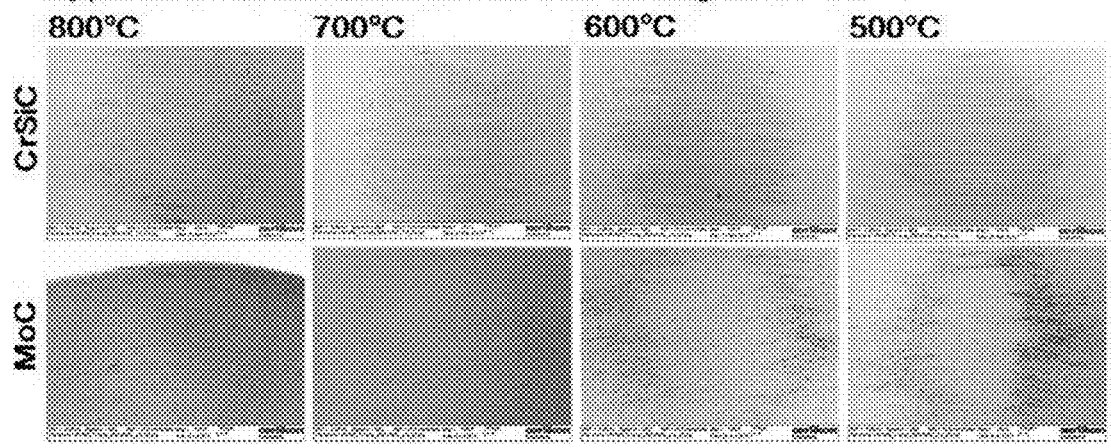

The invention shall now be described in detail with examples and with the help of the tables and figures.

PVC Routine for MoC Preparation According to First Aspect

MoC coating (system) was deposited by reactive cathodic arc evaporation.

The test pins were wet-chemically cleaned prior to deposition.

After evacuation of the process chamber below 10-5 mbar, standard heating and etching was done in order to ensure good layer adhesion to the substrate.

The targets used were composed of pure Molybdenum (for functional layer) and pure Chromium (for the interlayer) and operated in reactive mode with appropriate gases (N2, C2H2, Ar) by use of gas flow controllers.

The coating deposition temperature was about 450° C.

The MoC coating system consists of 4 sub-layers:

CrN interlayer: Operation of 2×Cr targets in pure N2 atmosphere (at 3 Pa) at 150 A source current, 0.6 A coil current and bias of 20 V;

CrMoN transition layer: Operation of 2×Cr & 2×Mo targets in pure N2 atmosphere (at 3 Pa N2) at 150 A source current and 0.6 A coil current for Cr and 220 A source current and 0.4 A coil current for Mo and with a bias of 20 V;

CrMoN+C transition layer: Operation of 2×Cr & 2×Mo targets in mixed Ar, N2 and C2H2 atmosphere (with overall pressure ramp from 3 to 1.5 Pa) at 150 A source current and 0.6 A coil current for Cr and 220 A source current and 0.4 A coil current for Mo and with a bias of 20 V;

MoC top layer: Operation of 2×Mo targets in mixed Ar and C2H2 atmosphere (at 1.5 Pa Ar pressure and 200 sccm C2H2) at 220 A source current and 0.4 A coil current for Mo and with a bias of 20 V.

HT-SRV testing Coating vs. AlSi/22MnB5

Application-orientated internal HT-SRV-Testing at 800-500° C.

SRV testing routine: After austenitization of the metal blank at 900° C. for 10 min and subsequent cooling to the respective testing temperature (800° C., 700° C., 600° C. and 500° C.), the coated counterpart (Pin) was inserted and loaded onto the coating surface. Sliding was done for 2.5 min. (see FIG. 35)

Conclusion:

AlCrN, TiAlN and Mo coatings are used to compare with inventive carbide coatings Inventive MoC coating with superior HT performance in T-range 800-500° C.

Inventive CrSiC and WSiC have basically similar potential

Description of Warm or Hot Forming Tool According to Second Aspect

Some of the a-C:H:W coatings were deposited by sputtering using an Oerlikon Balzers RS50 machine at a process temperature or substrate temperature lower than 150° C. applying a 2-fold substrate rotation. Pure chromium targets were used for sputtering deposition of a chromium interlayer as adhesion layer having a thickness of about 0.6 μm. For the deposition of the functional a-C:H:W coating with an overall thickness of about 2.4 μm four WC-containing targets were used, each target comprising about 6% Ni in atomic percentage. The WC targets were sputtered in a mixed argon/acetylene atmosphere. The acetylene flow was higher than the argon flow for all experiments. Bias voltages under 300 V were applied at the substrates. Additionally for some experiments, on top of the functional a-C:H:W coating, a run-in a-C:H:W layer was deposited by using an increased acetylene flow.

Coatings of the type a-C:H:W are X-ray-amorphous diamond like carbon coatings comprising beside carbon and hydrogen also tungsten; tungsten can be available in the coating at least partially as tungsten carbide (WC) embedded in the amorphous carbon hydrogen matrix (a-C:H). These type of coatings belong to the group of the metal-doped a-C:H coatings (a-C:H:Me) which are frequently employed in different tribological applications, as e.g. on movable parts in engines or gear boxes, on components in machines which are operated under high mechanical loading or on tools for forming and cutting of metallic work pieces.

Due to their outstanding properties like low friction and high wear resistance, a-C:H—W coatings are frequently used for improving performance of tools used in cold metal sheet forming operations, particularly, in order to prevent galling (material build-up) on the tool surface (see e.g. B. Podgornik et al. Surf. Coat. Tech. 184 (2004) 338, P. Carlsson et al. Surf. Coat. Tech. 200 (2006) 4654, F. Clarysse et al. Wear 264 (2008) 400 and E. E. Vera et al. Wear 271 (2011) 2116).

As it was already mentioned before, the tool wear behavior in hot sheet metal forming applications (the industrially applied technology is called hot stamping or press hardening of ultra-high strength steels like 22MnB5 for production of structural automotive parts like the B-pillar) is currently confronted with severe galling phenomena, in particular when coated (e.g. AlSi or Zn-based) metal sheets are used (see e.g. J. Pujante et al. CHS2 proceedings 2011 p. 377, J. Kondratiuk et al. Wear 207 (2011) 839).

Even though literature reports regarding performance of a-C:H:W coatings during hot stamping of coated metal sheets are missing, it has been stated recently in WO2012/104048A1, as already mentioned before, that a-C:H:W coatings have a rather low potential to improve tool performance during hot stamping of AlSi-coated sheets as one can read the following (see p. 3, lines 20-22): "Especially using AlSi-coated high-strength steels like USIBOR 1500 the galling phenomenon could not be satisfactorily reduced . . . " This conclusion is apparently directly linked to the investigations performed by F. Clarysse et al. Wear 264 (2008) 400. However, as already mentioned above, these studies are concerned with the tribological coating performance during metal sheet forming at room temperature, not with the tribological coating performance during metal sheet forming exceeding temperatures of 500° C., which is, however, the case for hot stamping processes.

Moreover, Clarysse et al. reported to have analyzed particularly an a-C:H:W coating from the company Oerlikon Balzers which is known under the product name Balinit C with the common abbreviation WC/C. The general recommendation regarding maximal service temperature is 300 C based on the argumentation that coatings of the type DLC or doped DLC (except e.g. Si-doped DLC) lose chemical and mechanical stability at temperatures above 300 C. Against this background it will be commonly assumed that such coatings are not suitable for warm or hot metal forming operations at which the coatings are exposed to temperatures above 500 C, even though such coatings can be very useful for cold metal forming operations However, the inventor was very curious to asses the real coating performance in order to understand in more detail why a-C:H:W coatings are not suitable for hot metal forming applications.

For the experiments the inventor decided to test a-C:H:W coatings such as the WC/C coating from the company Oerlikon Balzers produced under the name Balinit C.

High temperature tribological investigations against coated (AlSi and Zn-based) ultra-high strength steels (22MnB5) were done in order to provide a sound basis for the assessment of abrasive and adhesive wear behavior of the a-C:H:W coatings. Well-established AlCrN coatings as well as substrates whose surface was submitted to plasma nitriding processes (here on top a compound layer consisting of Fe—N with a thickness of about 10 um was formed; in the following the compound layer will be abbreviated with CL) were used as reference for the comparative analysis.

Figure 6:
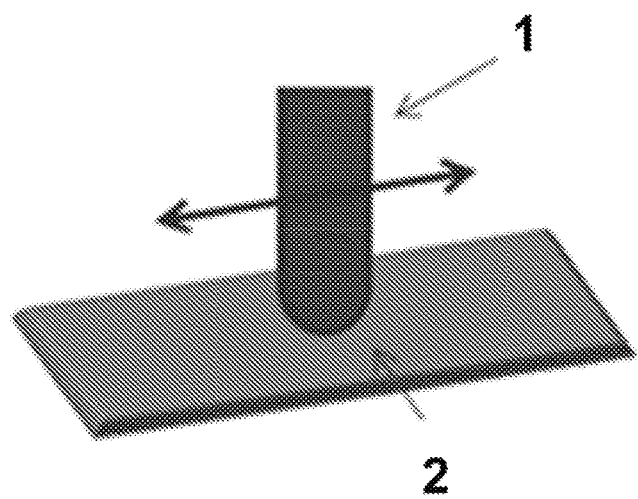
FIG. 6: HT-SRV test setup.

A high temperature reciprocating wear test (HT-SRV, Optimol Instruments GmbH) was employed for allowing an efficient tribological coating characterization in laboratory environment (a drawing of the test setup is shown in FIG. 6).

The lower part of the test consists of a coated metal sheet 2 (AlSi- or Zn-coated 22MnB5) which was first heated up to 900° C. for AlSi-coated 22MnB5 sheets or 880° C. for Zn-coated 22MnB5 sheets, respectively. A heating cartridge positioned under the metal sheet was used for heating. The temperature was subsequently hold constant for about 10 min and after that, the metal sheet was cooled down to 600° C. for AlSi-coated 22MnB5 sheets or 700° C. for Zn-coated 22MnB5 sheets, respectively. Shortly prior to the onset of the tribological test, the upper part of the test which consists of a coated SRV-Pin 1 was mounted into the device as well, loaded with 10N onto the surface of the lower part and was put in reciprocated sliding motion at a frequency of 1 Hz during 2.5 min (covering a displacement distance of several millimeters).

In order to get more information about the wear behavior of the coating as function of testing time, the same 2.5 min test routine was repeated 10 times in succession by using for each test a new (unused) metal sheet but keeping the coated SRV-Pin unchanged.

After tribological testing the coated SRV-Pin was transferred to the scanning electron microscope (SEM) and the wear track was characterized with particular focus on the material build-up behavior (i.e. adhesive wear). A subjective classification from 1 to 5 was used in order to assess the adhesive wear, where 1 corresponds to "no build-up" and 5 corresponds to "very significant build-up".

In addition, the abrasive wear was determined quantitatively by measuring the coating thickness (by calotte grinding method) outside as well as inside the wear track. Thus, it was possible to obtain the abrasive wear in % normalized to a coating thickness of 8 microns.

Relevant coating properties of the examined surfaces (coated and nitrided surfaces; nitrided with compound layer CL) are summarized in FIG. 36.

Figure 10:
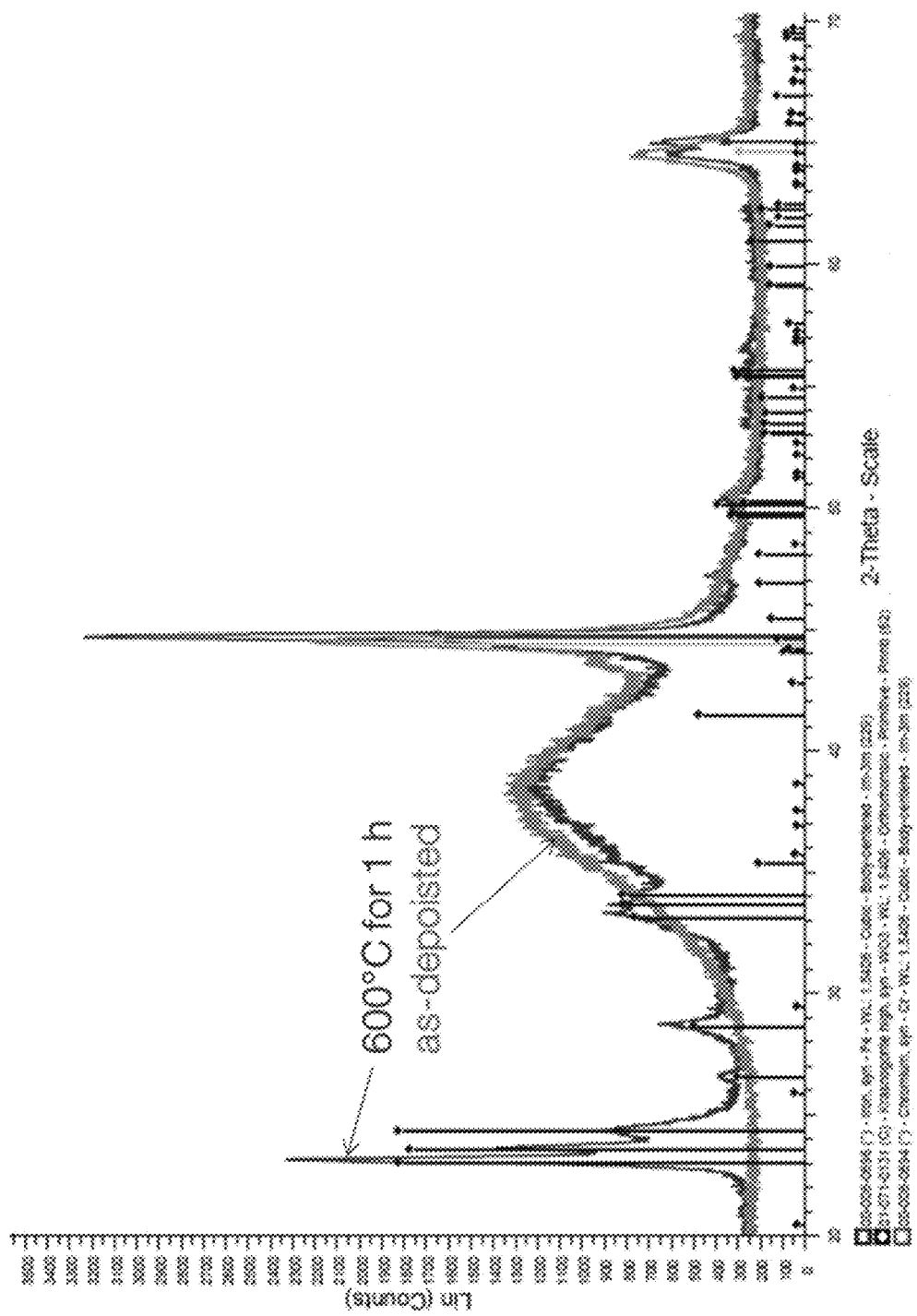
FIG. 10: XRD pattern taken before and after annealing at 600° C. for 1 h.

The inventor tested a-C:H:W coatings had an overall coating thickness of about 3 microns. A pure chromium layer was deposited as adhesion layer between the substrate surface and the functional a-C:H:W layer in order to attain better coating adhesion. The a-C:H:W coatings exhibited an amorphous X-ray spectrum as it is shown in FIG. 10.

The abrasive wear resistance of the a-C:H:W coatings examined at RT (room temperature) against $Al_2O_3$ was significantly higher as compared with the nitrided-CL substrates but similarly good as compared with the AlCrN coatings.

The inventor tested a-C:H:W coatings having overall hardness of about 10 GPa as well as of about 15 GPa, were examined. Particularly, a-C:H:W coatings exhibiting rather moderate coating hardness of about 15 GPa showed better wear behavior.

The friction behavior at RT against $Al_2O_3$ in dry conditions was characterized by an outstanding coefficient of friction of about 0.1.

Figure 7:
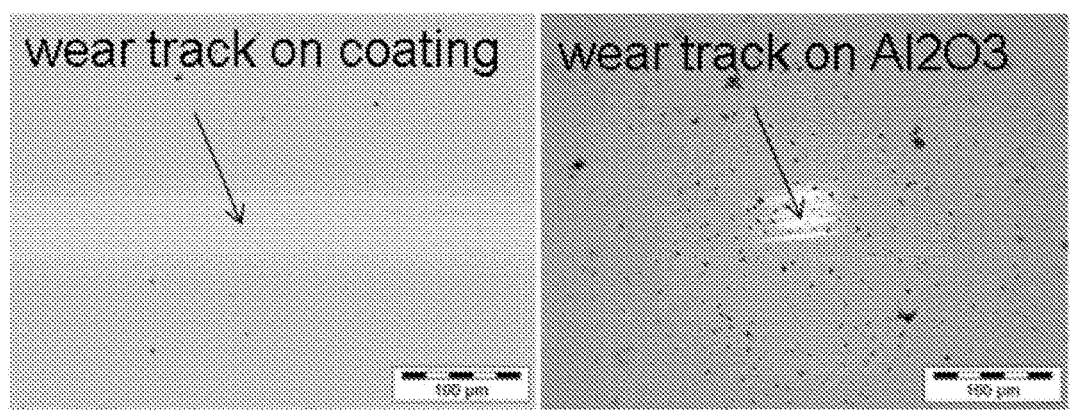
FIG. 7: Wear tracks on a-C:H:W coatings and counter body ($Al_2O_3$ ball) after tribological ball on disc test.

The wear track on the coating surface as well as the wear track on the $Al_2O_3$ ball demonstrates the superior tribological performance (see FIG. 7).

Furthermore, in order to assess the high temperature performance in ambient atmosphere regarding structural and chemical stability, annealing experiments at 600° C. for 1 hour in ambient atmosphere were done. The results regarding oxidation behavior (i.e. formation of oxide layer thickness as measured in cross-sectional SEM analyses) are shown in Tab. 1 in % normalized to a coating thickness of 8 microns.

Figure 8:
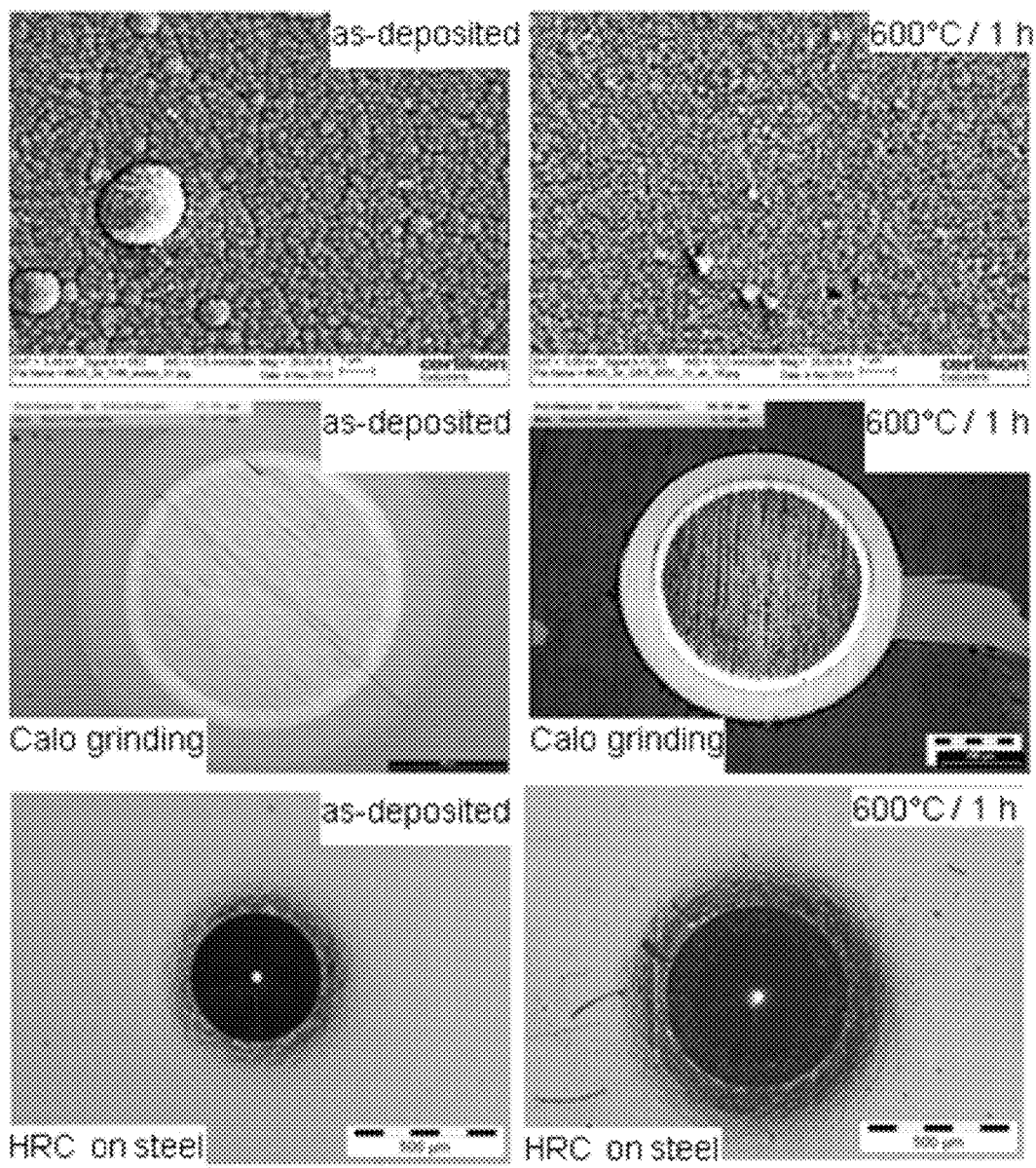
FIG. 8: SEM top-view micrographs, Calo grindings and HRC indents on the as-deposited and the annealed (600° C. for 1 h) specimens.

The a-C:H:W coatings showed good oxidation resistance at 600° C. for 1 h as compared with nitrided-CL substrates, whereas AlCrN coatings were fully free of any oxidation. After annealing at 600° C. for 1 h the surface of the tested a-C:H:W coatings exhibited clearly visible microstructural changes (see SEM images shown in FIG. 8).

Figure 9:
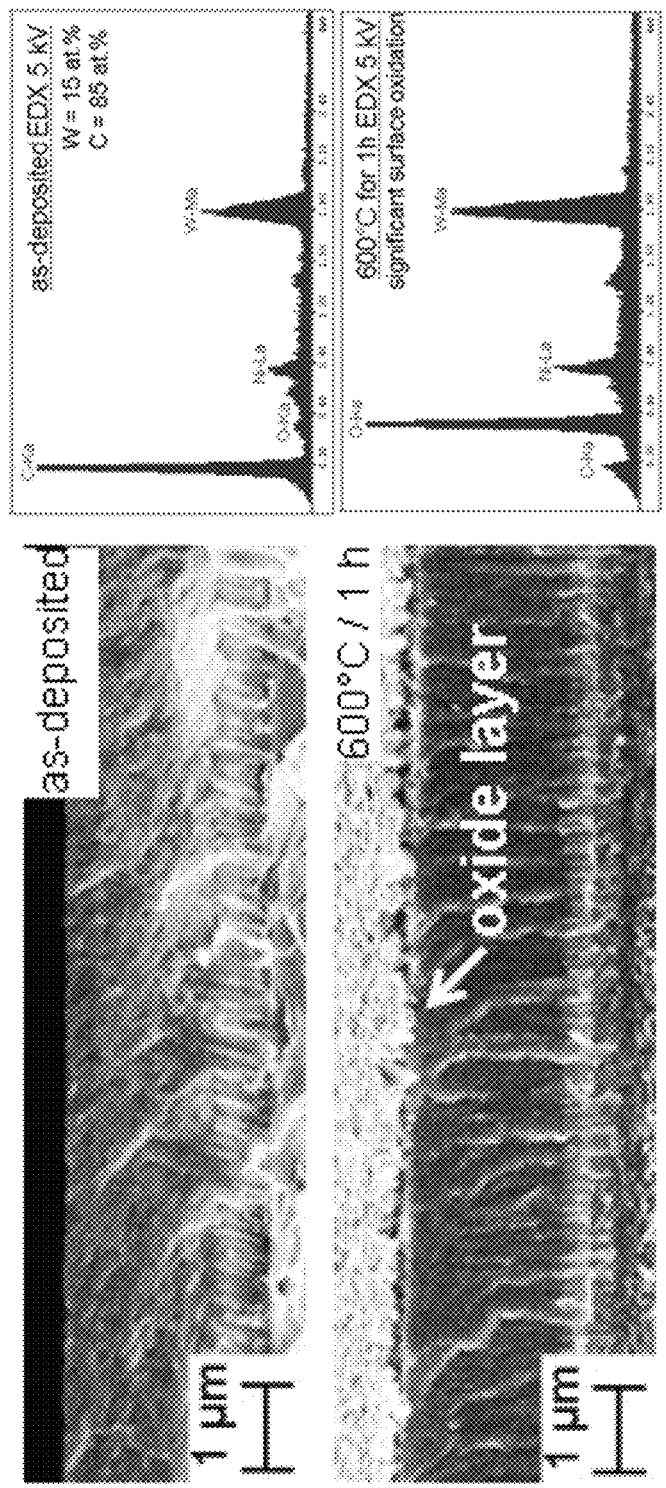
FIG. 9: Cross-sectional (fracture) SEM micrographs (left) and top-view EDX spectra with 5 kV acceleration voltage (right) of the as-deposited and the annealed specimens.

Cross-sectional SEM micrographs (see FIG. 9 left) revealed the formation of an oxide layer with a thickness in the range of some hundreds of nanometers and top-view EDX analyses with 5 kV acceleration voltage confirmed that the oxide layer consist predominantly of tungsten and oxygen (see FIG. 9 right). Finally by means of XRD it was unequivocally possible to show that the oxide layer is composed of crystalline orthorhombic $WO_3$ (see FIG. 10).

Additionally to the oxidation behavior at 600° C. for 1 h, it was possible to demonstrate by the annealing experiments that tested a-C:H:W coatings exhibit good structural stability at these annealing conditions. The Calo grinding (see FIG. 8), the cross-sectional SEM micrograph (see FIG. 9 left) as well as the HRC indent (see FIG. 10) after annealing at 600° C. for 1 h showed clearly that the coating is preserved (some minor microstructural modifications are visible) still exhibiting excellent coating adhesion.

Moreover, the comparison of the XRD pattern taken before and after annealing indicates that the "amorphous hump" originating from the "X-ray amorphous" a-C:H:W coatings is more or less unaffected, i.e. the structure of a-C:H:W coatings was not significantly changed upon annealing.

Figure 11:
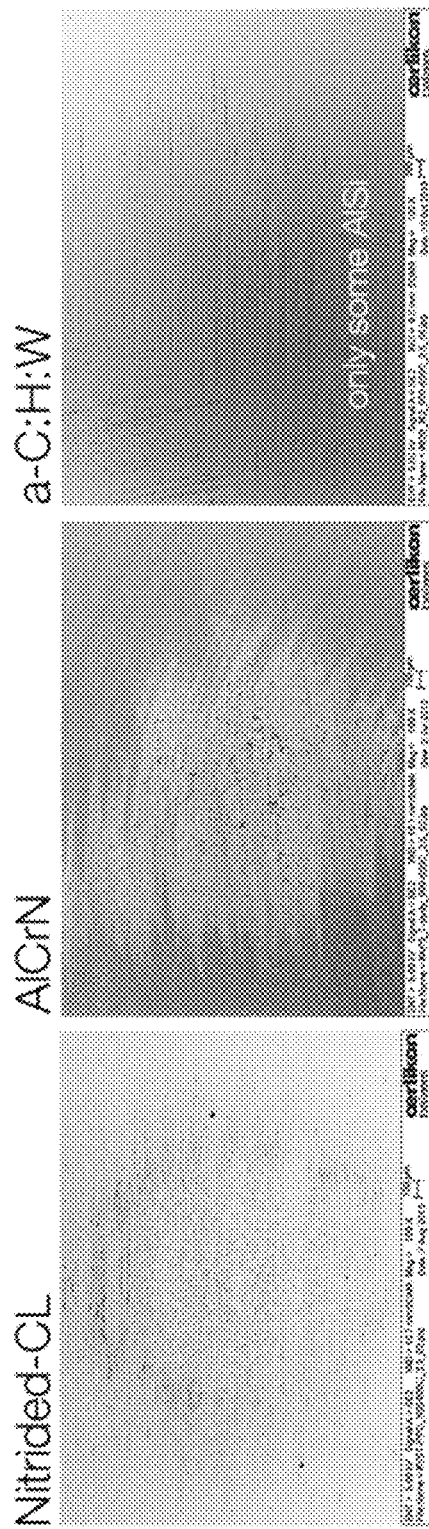
FIG. 11: SEM micrographs of the wear tracks after 2.5 min testing at 600° C. for tribosystem coating vs. AlSi/22MnB5. Build-up material is AlSi-based.

The results of the HT-SRV test for the tribosystem coating vs. AlSi/22MnB5 are shown in FIG. 37 and FIG. 11. Adhesive wear was evaluated with the number 1 as the best behavior and with the number 5 as the worst behavior; abrasive wear was reported as coating loss in % normalized to 8 μm. The coefficient of friction (COF) was measured as well.

The tested a-C:H:W coatings showed after one 2.5 min test no abrasive as well as nearly no adhesive wear, which clearly reveals the potential of such a-C:H:W coatings for improving performance of hot metal forming tools, particularly for enhancing performance of hot metal sheet forming tools as well by improving performance of surfaces involved in hot stamping applications (see FIG. 11).

After 10 repetitions of the same 2.5 min SRV test the tested a-C:H:W coatings were still more or less free of AlSi build-up, but abrasive wear became an issue. However, the level of abrasive wear was of the same magnitude as for the industrially applied nitrided-CL surface, which can be taken as a kind of industrial reference, i.e. it can be assumed that this level of abrasive wear is acceptable.

Very striking is the significantly lower coefficient of friction (COF) for a-C:H:W measured directly during testing against AlSi/22MnB5 as compared to the benchmark. The COF is by a factor of about 4 smaller. The superior performance of a-C:H:W might be related to the significantly reduced COF.

The inventor found it very surprising that in spite of the widely accepted fact that a-C:H and metal doped a-C:H coatings (excepting a-C:H:Si coatings) such as a-C:H:W coatings are not useful for high temperature applications exceeding temperature of 300° C., such type of coatings can indeed be very good promising candidates for industrial hot metal forming applications such as hot stamping and hot metal sheet forming of coated ultra-high strength steels.

The inventor tested a-C:H:W coatings showed upon ongoing testing abrasive wear behavior which is comparable to industrial benchmark, however, it is likely that the main advantage of this type of coatings against AlSi-coated sheets is that they remain nearly free of AlSi build-up upon long-term operation (upon prolonged testing).

Figure 12:
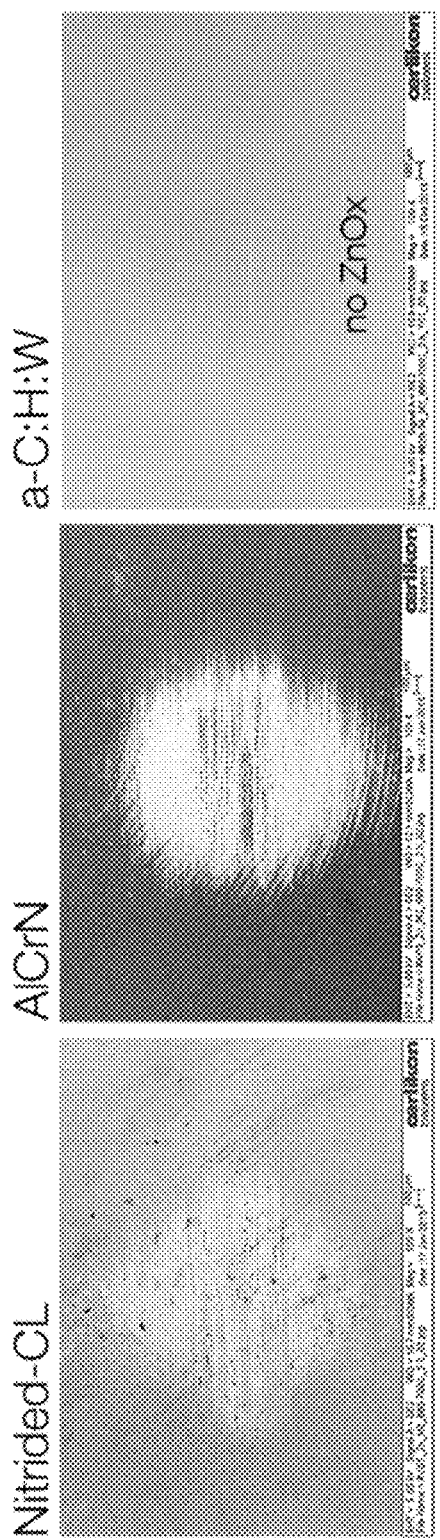
FIG. 12: SEM micrographs of the wear tracks after 2.5 min testing at 700° C. for tribosystem coating vs. Zn-based/22MnB5. Build-up material is ZnOx-based.
Figure 17:
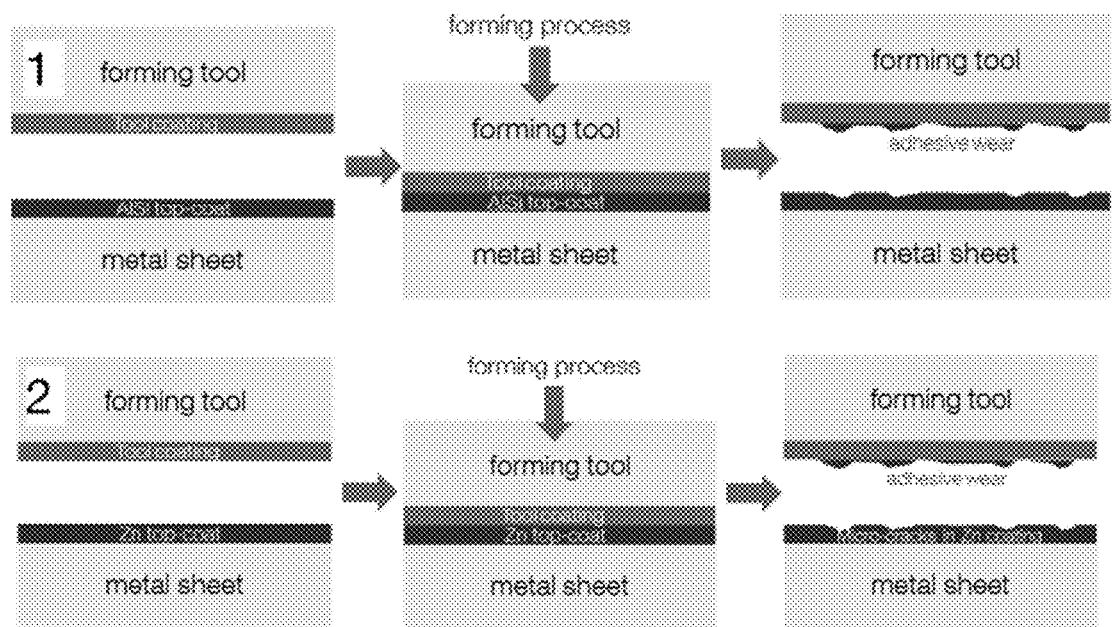
FIG. 17: Schematic illustration of the hot stamping process related complications for (1) AlSi-based and (2) Zn-based metal sheets.

The results of the HT-SRV test for the tribosystem coating vs. Zn-based/22MnB5 are shown in FIG. 38 and FIG. 12. Adhesive wear was evaluated with numbers, the number 1 corresponding to the best and the number 5 corresponding to the worst behavior, respectively. Abrasive wear was reported as coating loss in % normalized to 8 μm. The coefficient of friction (COF) was measured as well.

The inventor tested a-C:H:W coatings show after one 2.5 min test no abrasive as well as no adhesive wear and after 10 repetitions of the same 2.5 min SRV test these coatings were still absolutely free of any ZnOx build-up, and, very surprisingly, still without abrasive wear. This unexpected results clearly show that a-C:H:W coatings are particularly very promising for hot stamping or hot metal sheet forming of Zn-based coated metal sheets.

Also very striking is the significantly lower coefficient of friction (COF) for a-C:H:W measured directly during testing against Zn/22MnB5 as compared to the benchmark. The COF is by a factor of about 2 smaller. The superior performance of a-C:H:W might be related to the significantly reduced COF. As mentioned before, it has already been speculated that process lubrication might be useful to reduce the degree of micro-cracking in particular for Zn-coated sheets. Therefore the reduced COF of a-C:H:W might indeed be relevant for optimized manufacturing of Zn-coated metal sheets where the formation of micro-cracks upon forming is of paramount significance.

Figure 30:
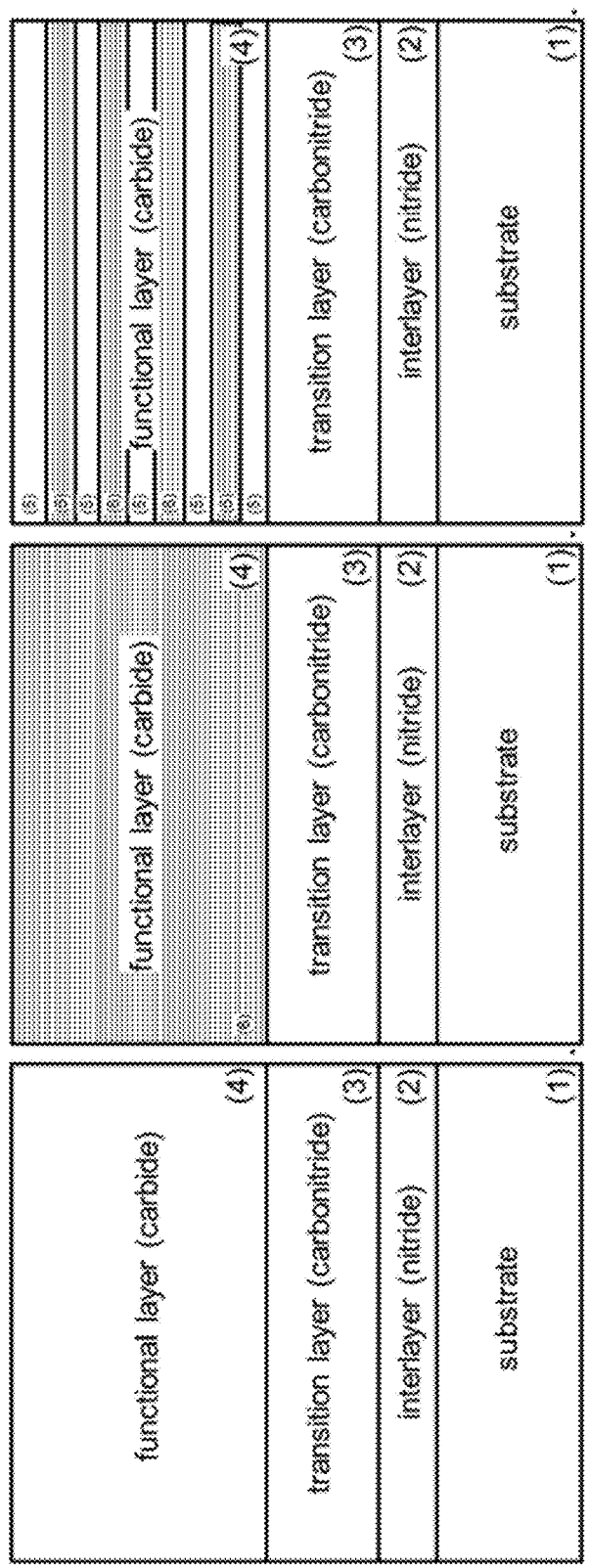
FIG. 30: MoC coating systems with various functional layers.
Figure 31:
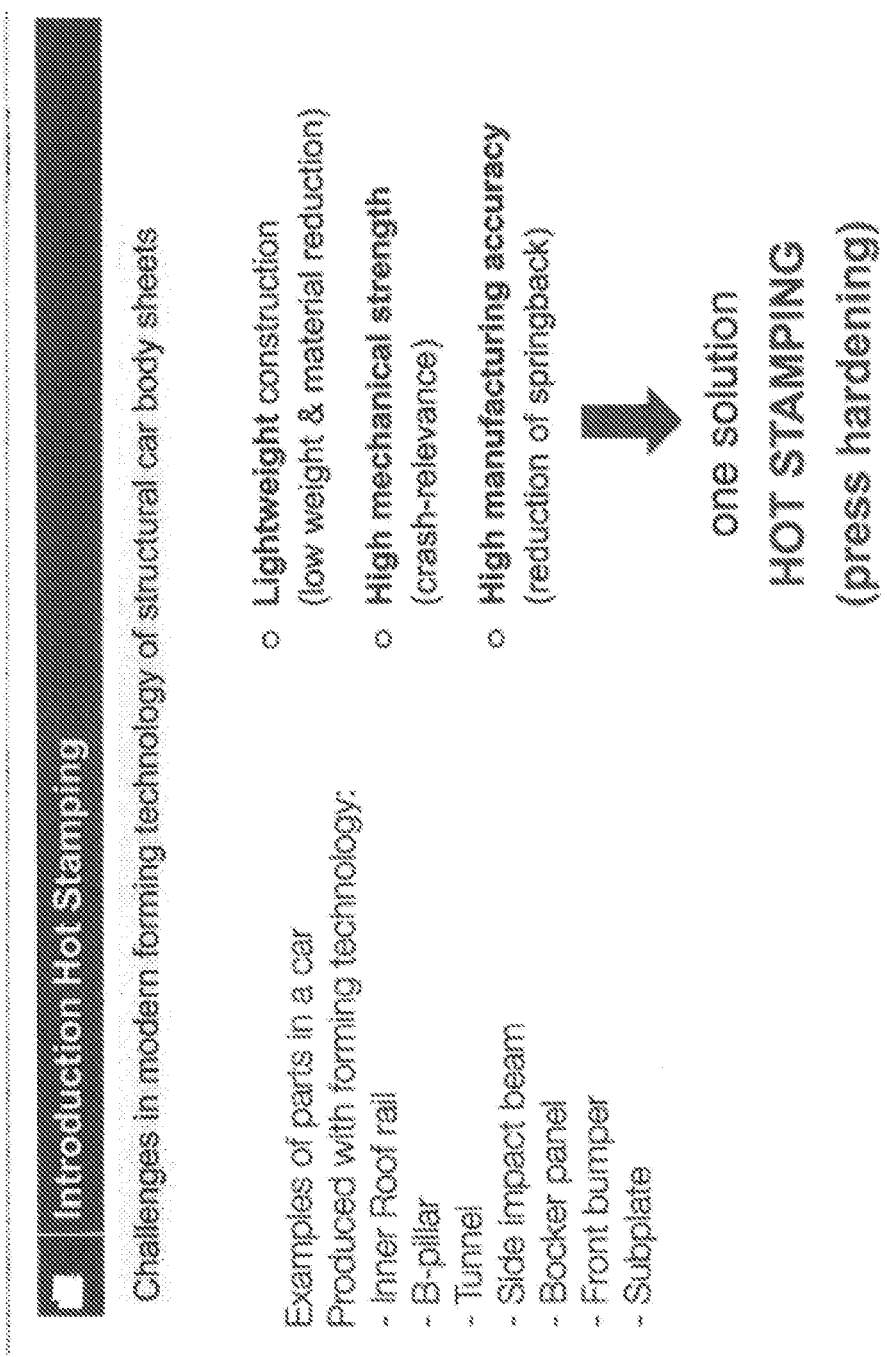
FIGS. 31 and 32: Introduction hot stamping.
Figure 32:
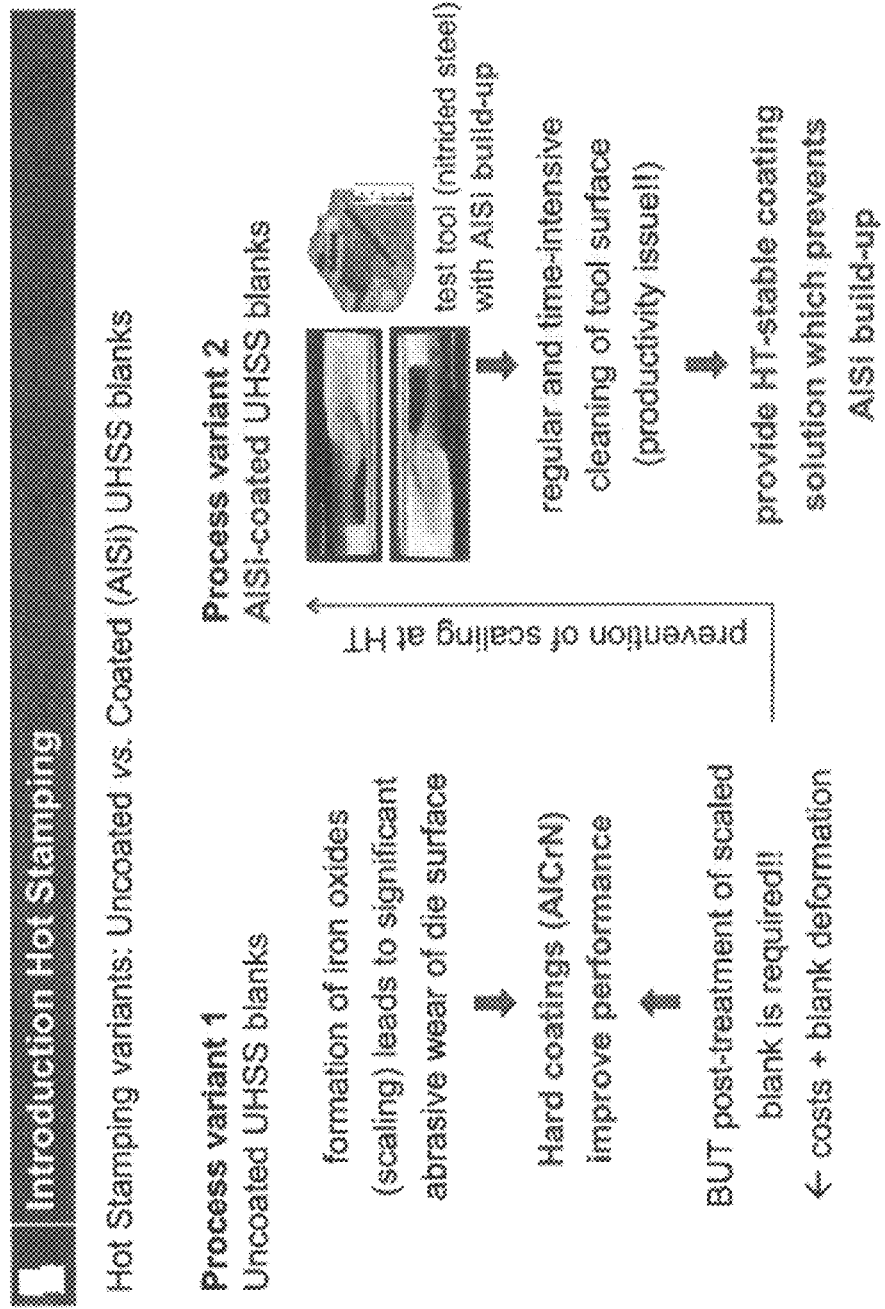
Figure 33:
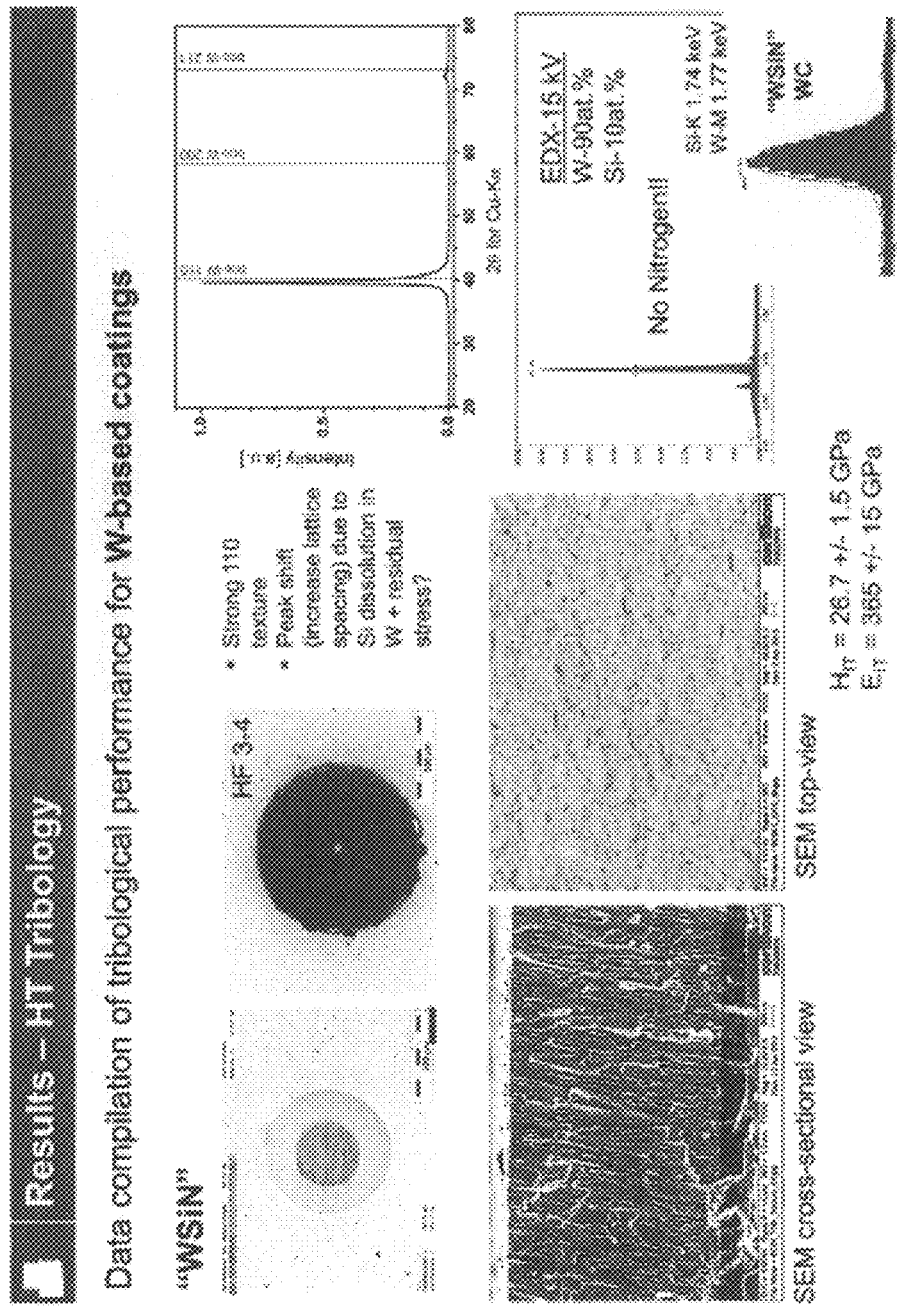
FIGS. 33 and 34: Results—HT tribology.
Figure 34:
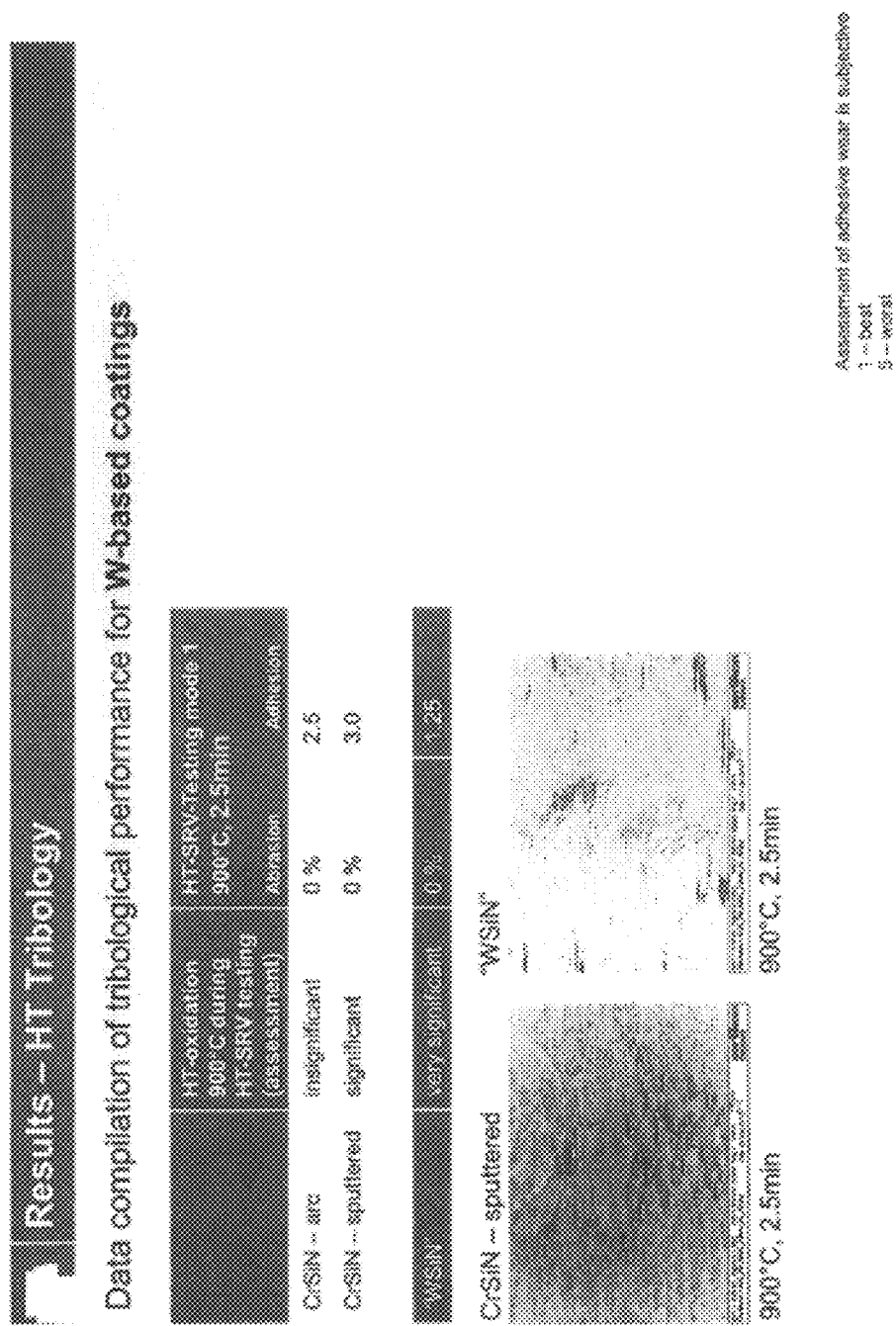

Description of Hard Coating Comprising at Least One Mo—C (Molybdenum Carbide) Hard Layer According to Third Aspect The Mo—C coatings (molybdenum carbide) were deposited by reactive cathodic arc evaporation using an Oerlikon Balzers Innova deposition system. After evacuation of the process chamber below 10-5 mbar, standard heating and etching was done in order to ensure good layer adhesion to the substrate. The targets used were composed of pure Molybdenum (for deposition of the functional layer) and other metallic targets like for example Chromium, Chromium-Silicon, Titanium, Titanium-Aluminum and Aluminum-Chromium (for the deposition of the inter- and transition layer) and operated in reactive mode with appropriate gases (N2, C2H2, and/or Ar) by use of gas flow controllers. The overall coating thickness was in the range of 4-6 μm. The coating deposition temperature was about 450° C. In order to ensure good coating adhesion of the whole coating system (onto steel, tungsten carbide and other ceramic substrates 1, see FIG. 30), a nitride interlayer 2 (e.g. CrN, see FIG. 30) was deposited in pure N2 atmosphere at 3 Pa pressure and a low bias voltage of 20 V with a thickness of about 0.5 μm. Subsequently, in order to move very smoothly from the nitride to the carbide regime, the C2H2 flow was increased together with the Ar flow while the N2 flow was decreased over an extended time such that the carbonitride transition layer 3 (e.g. CrCN, see FIG. 30) exhibited an overall thickness of 1-2 μm. This improved the coupling to the above following pure Mo—C layer. Then the functional Mo—C layer 4 (see FIG. 30) was deposited in a mixed C2H2/argon atmosphere with different C2H2/argon ratios, i.e. with different C2H2 flows (50-300 sccm) in order to obtain pure Mo—C coatings with different Mo/C-ratios. The transition and functional layers were deposited using the same bias voltage of 20 V as it was recognized that increasing bias voltage does not improve coating performance with particular focus on tribology.

In the following the focus will be laid on the microstructural characterization of the functional Mo—C layer as function of C2H2 flow. Following to that the tribological properties at room and elevated temperatures will be discussed.

Figure 18:
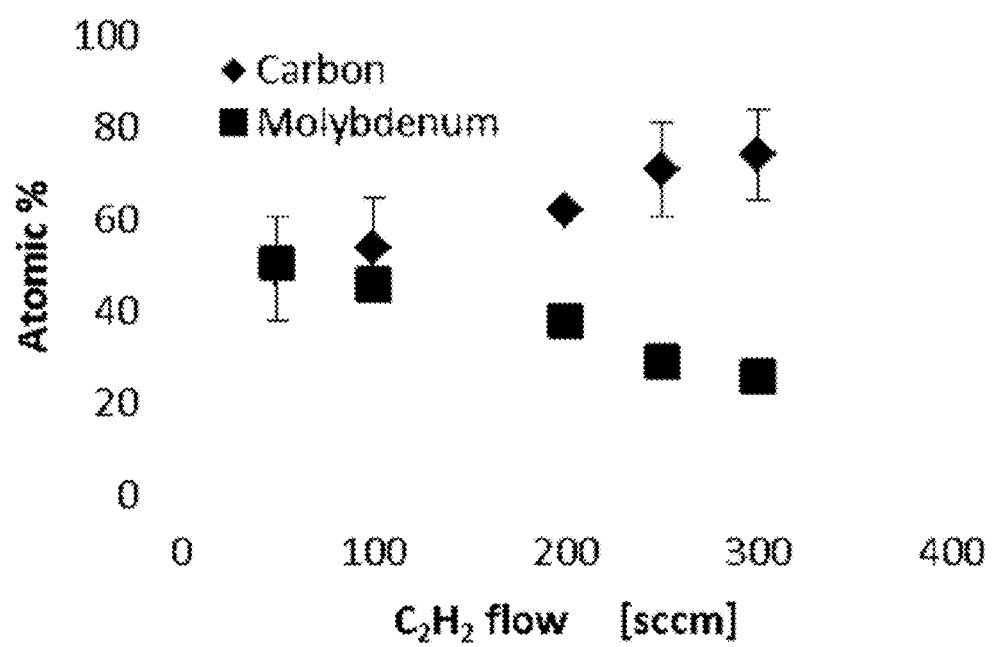
FIG. 18: Correlation between C2H2 flow in sccm and measured chemical composition of Mo—C coatings by standard-less EDS at 15 kV.

The correlation between C2H2 flow in sccm and the measured chemical composition of Mo—C coatings by standard-less energy dispersive X-ray spectroscopy (EDS) with an acceleration voltage of 15 kV is shown in FIG. 18. With increased C2H2 flow from 50 to 300 sccm C2H2 the Mo/C-ration decreases, i.e. the Mo—C coating becomes more and more riche in Carbon.

Figure 19:
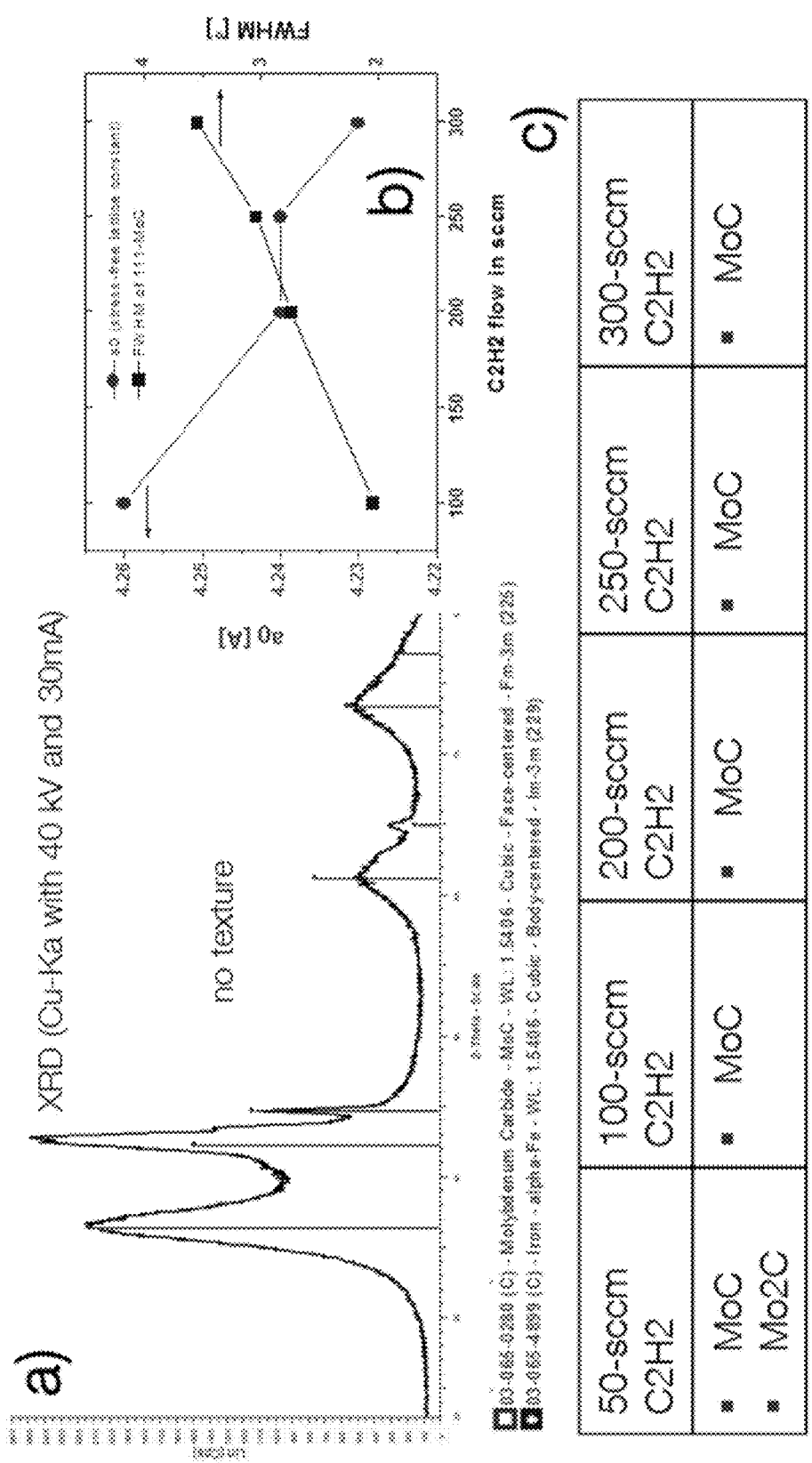
FIG. 19: Correlation between C2H2 flow in sccm and measured phase composition by X-ray diffraction with Cu-Ka with 40 kV and 30 mA of Mo—C coatings (c), XRD pattern of the Mo—C coating with 200 sccm C2H2 flow (a) and change of stress-free lattice constant in the fcc structure including the absolute change (i.e. measured against Al2O3 NIST Standard SRM 1976a) of FWHM of 111 peak as function of C2H2 flow in sccm (b).

X-ray diffraction phase analyses (with Cu-Ka and 40 kV/30 mA using parallel-beam geometry and an energy dispersive detector) were done in order to investigate the corresponding phase evolution as well. As visible in FIG. 19c), the Mo—C coatings with C2H2 flow from 100-300 sccm are single-phase consisting of face-centered cubic (fcc) MoC whereas the lattice constant of the fcc-MoC is decreasing with increased C2H2 flow (see FIG. 19b). Only for C2H2 flow of 50 sccm a double-phase Mo—C coating comprising Mo2C and MoC was observed. The XRD pattern shown in FIG. 19a) is representative for all Mo—C coatings with a C2H2 flow of 100-300 sccm, apart from the fact the diffraction intensity as well as the full width at half maximum of the diffraction lines are different. It was observed that with increased C2H2 flow the diffraction lines are getting significantly broader which indicates a significant decrease in crystallite size (see FIG. 19b), however, the more or less random crystallite orientation as visible in FIG. 19a) remained unchanged, which indicates that these coatings do not exhibit pronounced crystallographic textures.

Figure 20:
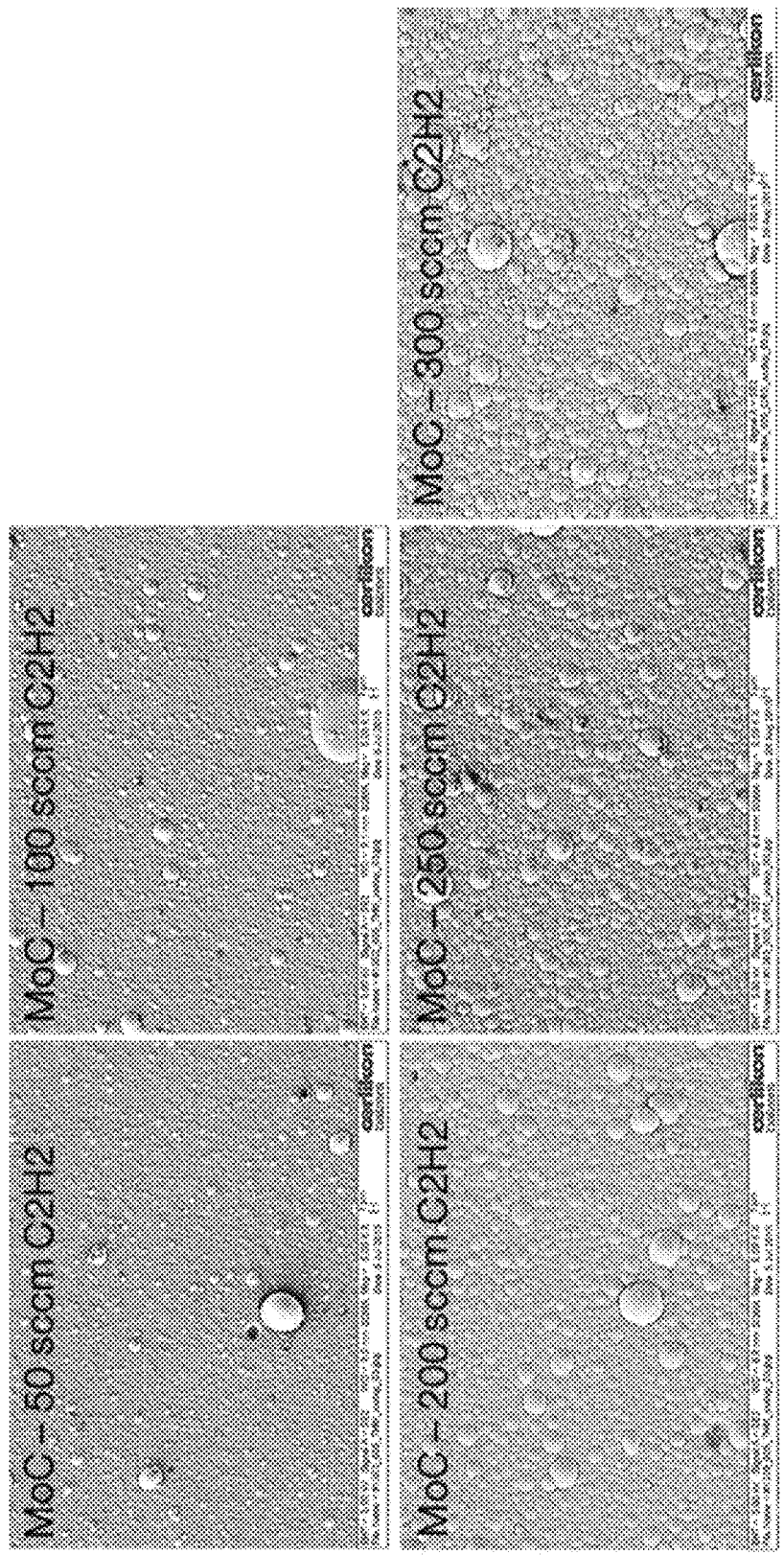
FIG. 20: Top-view SEM micrographs of as-deposited Mo—C coating surface as function of C2H2 flow in sccm.
Figure 21:
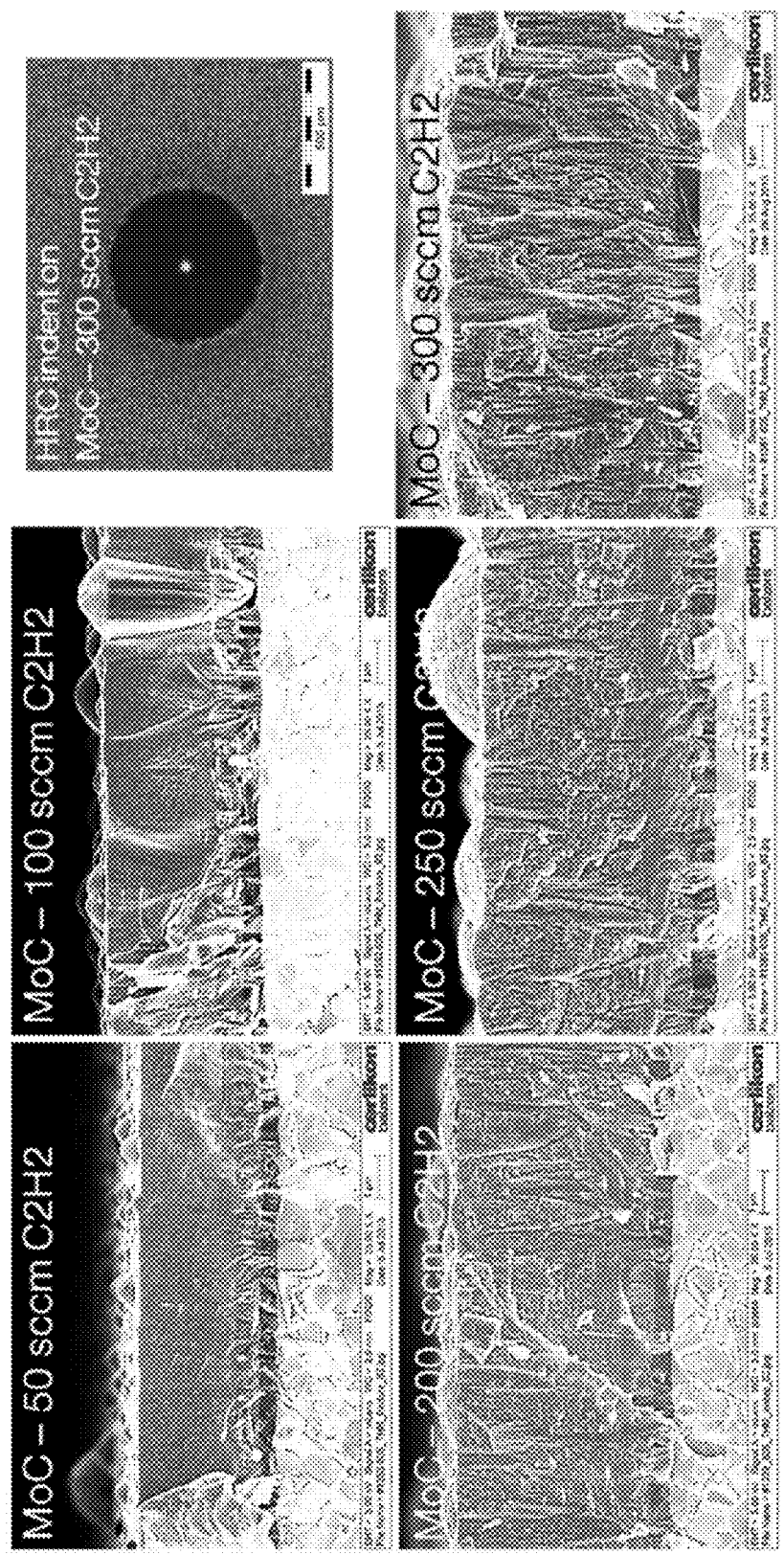
FIG. 21: Cross-sectional (fracture) SEM micrographs of as-deposited Mo—C coating grain morphology as function of C2H2 flow in sccm. For MoC-300 sccm C2H2 the HRC indent is shown as well.

The top-view and cross-sectional SEM micrographs of as-deposited Mo—C coatings as function of C2H2 flow are shown in FIGS. 20 and 21, respectively. It is evident that the Mo—C coatings can be subdivided into two (microstructural) groups regarding surface and fracture morphology, i.e. Mo—C coatings with C2H2 flow of 200 sccm and more exhibit a rather defect-rich surface (many droplets) with a fine-structured "grain" fracture morphology. However, Mo—C coatings with C2H2 flow of 50 and 100 sccm appear much denser ("glass-like") exhibiting less surface defects (droplets). In addition to that it is also clearly visible that the mechanical properties of the Mo—C coatings are changing significantly with C2H2 flow.

Figure 22:
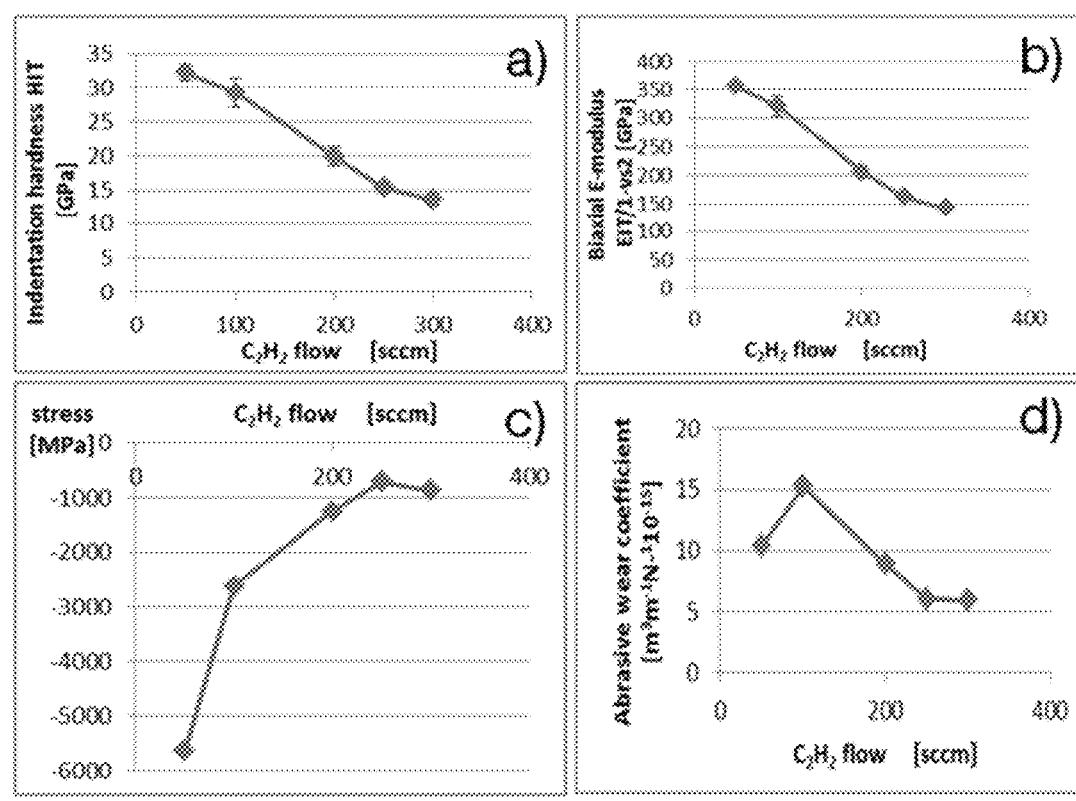
FIG. 22: Correlation between C2H2 flow in sccm and mechanical properties of Mo—C coatings: a) indentation hardness, b) biaxial Young's modulus, c) residual mechanical stress and d) abrasive wear coefficient measured at RT against Al2O3.

Generally it can be said that coating hardness, biaxial Young's modulus, residual compressive stress and abrasive wear coefficient decrease with increased C2H2 flow (see FIG. 22). This observation is in agreement with the variation in "grain" fracture morphology as discussed above.

Figure 23:
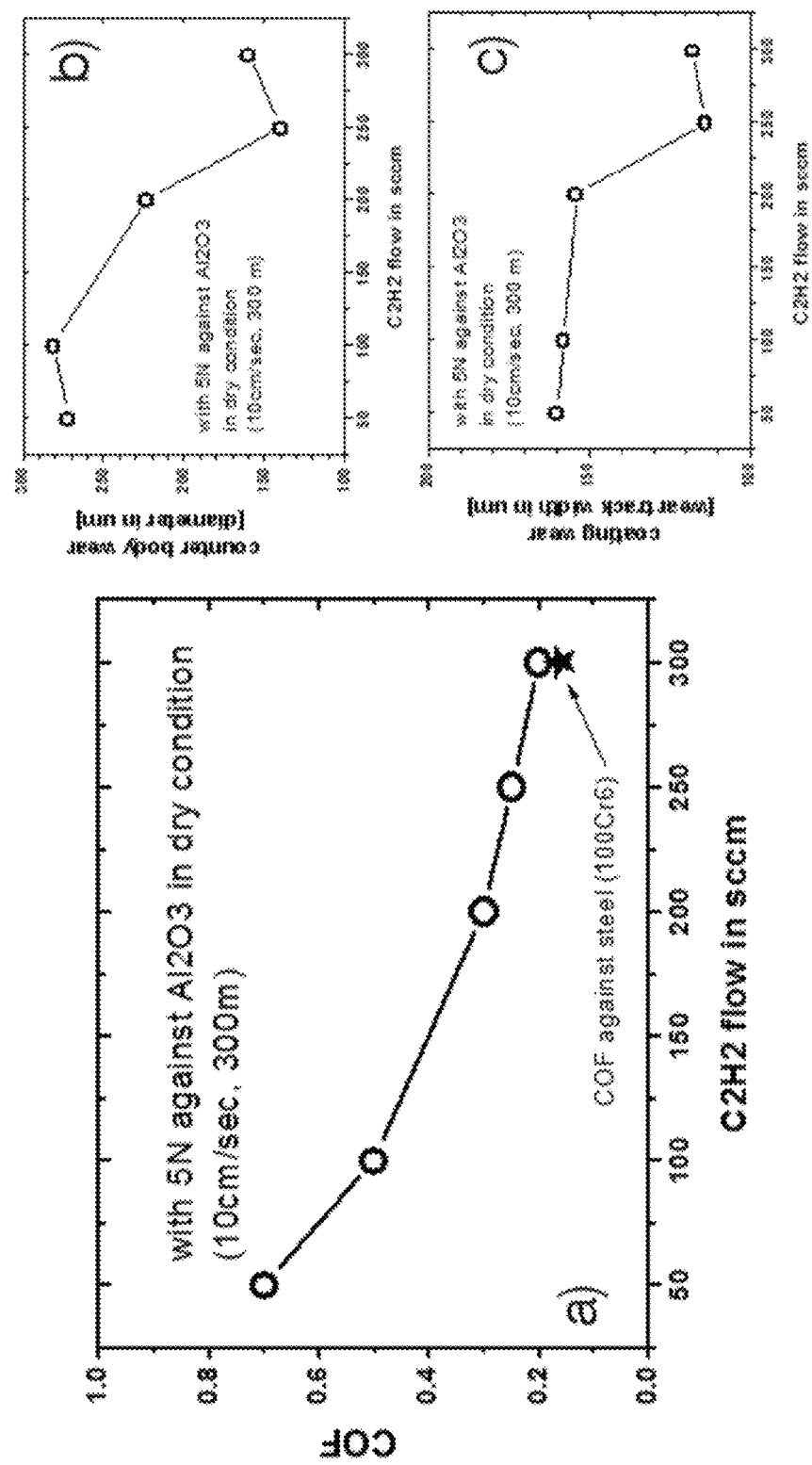
FIG. 23: Correlation between C2H2 flow in sccm and tribological properties of Mo—C coatings at room temperature: a) coefficient of friction against Al2O3, b) counter body wear and c) coating wear.

Standard tribological pin on disc tests at room temperature using A2O3 balls (with diameter of 8 mm; load of 5N, 10 cm/s speed and distance of 300 m) were done for the different Mo—C coatings as shown in FIG. 23. The coefficient of friction is decreasing significantly with increased C2H2 flow (see FIG. 23a). For the Mo—C coating with C2H2 flow of 300 sccm the pin on disc test was done against steel (100Cr6) as well and the measured coefficient of friction was even lower (about 0.16) as compared to Al2O3. Furthermore, the evaluation of the counter body (see FIG. 23b) and coating wear (see FIG. 23c) revealed again that the performance is increasing (i.e. wear is decreasing) with increased C2H2 flow.

High temperature tribological investigations against coated (AlSi and Zn-based) ultra-high strength steels (22MnB5) were done as well in order to provide a sound basis for the assessment of abrasive and adhesive wear behavior of the Mo—C coatings in comparison to benchmark coatings, MoN and other promising carbide systems (CrSiC and WSiC). As benchmark coatings well-established AlCrN and TiAlN coatings as well as substrates whose surface was submitted to plasma nitriding processes (here on top a compound layer consisting of Fe—N with a thickness of about 10 um was formed; in the following the compound layer will be abbreviated with CL) were used. The most relevant coating properties (as e.g. abrasive wear coefficient, hardness, coefficient of friction and oxidation behavior) of these systems are shown in FIG. 15.

A high temperature reciprocating wear test (HT-SRV, Optimol Instruments GmbH) was employed for allowing an efficient tribological coating characterization in laboratory environment (a drawing of the test setup is shown in FIG. 24).

The lower part of the test consisted of a coated metal sheet 2 (AlSi- or Zn-coated 22MnB5) which was first heated up to 900° C. for AlSi-coated 22MnB5 sheets or 880° C. for Zn-coated 22MnB5 sheets, respectively. A heating cartridge positioned under the metal sheet was used for heating. The temperature was subsequently held constant for about 10 min and after that, the metal sheet was cooled down to 800-500° C. for AlSi-coated 22MnB5 sheets or 700° C. for Zn-coated 22MnB5 sheets, respectively. Shortly prior to the onset of the tribological test, the upper part of the test which consisted of a coated SRV-Pin 1 was mounted into the device as well, loaded with 10N onto the surface of the lower part and was put in reciprocated sliding motion at a frequency of 1 Hz during 2.5 min (covering a displacement distance of several millimeters). In order to assess long-term performance (time-dependent wear behavior) for AlSi/22MnB5 at 600° C. and for Zn/22mNB5 at 700° C., respectively, the same 2.5 min test routine was repeated 10 times in succession by using for each test a new (unused) metal sheet but keeping the coated SRV-Pin unchanged.

After tribological testing the coated SRV-Pin was transferred to the scanning electron microscope (SEM) and the wear track was characterized with particular focus on the material build-up behavior (i.e. adhesive wear). A subjective classification from 1 to 5 was used in order to assess the adhesive wear, where 1 corresponds to "no build-up" and 5 corresponds to "very significant build-up".

In addition, the abrasive wear was determined quantitatively by measuring the coating thickness (by calotte grinding method) outside as well as inside the wear track. Thus, it was possible to obtain the abrasive wear in % normalized to a coating thickness of 8 μm.

In FIG. 13 the results obtained for the tribosystem coating vs. AlSi-based/22MnB5 after HT-SRV testing for 2.5 min and for different metal blank temperatures (800-500° C.) are shown. The compilation of the corresponding SEM wear track micrographs of the tested coatings are shown in FIG. 25. The benchmark coatings (nitrided-CL, AlCrN and TiAlN) but also MoN exhibited over the whole investigated temperature range (800-500° C.) rather poor adhesive wear performance, i.e. a lot of AlSi build-up was observed, in particular for AlCrN. TiAlN and Mon, even though abrasive wear was 0%. On the contrary, it is very striking that carbide coatings had generally significantly improved adhesive wear performance over the whole temperature range (800-500° C.), even though CrSiC-150 (Cr—Si—C coating with a C2H2 flow of 150 sccm) and also WSiC suffered from onset of abrasive wear which even increased with decreased temperature of the metal blank. However, Mo—C coatings with C2H2 flow of 200 sccm (MoC-200) exhibited for all applied temperatures no abrasive wear and additionally to that remained nearly fully free of AlSi build-up.

Figure 26:
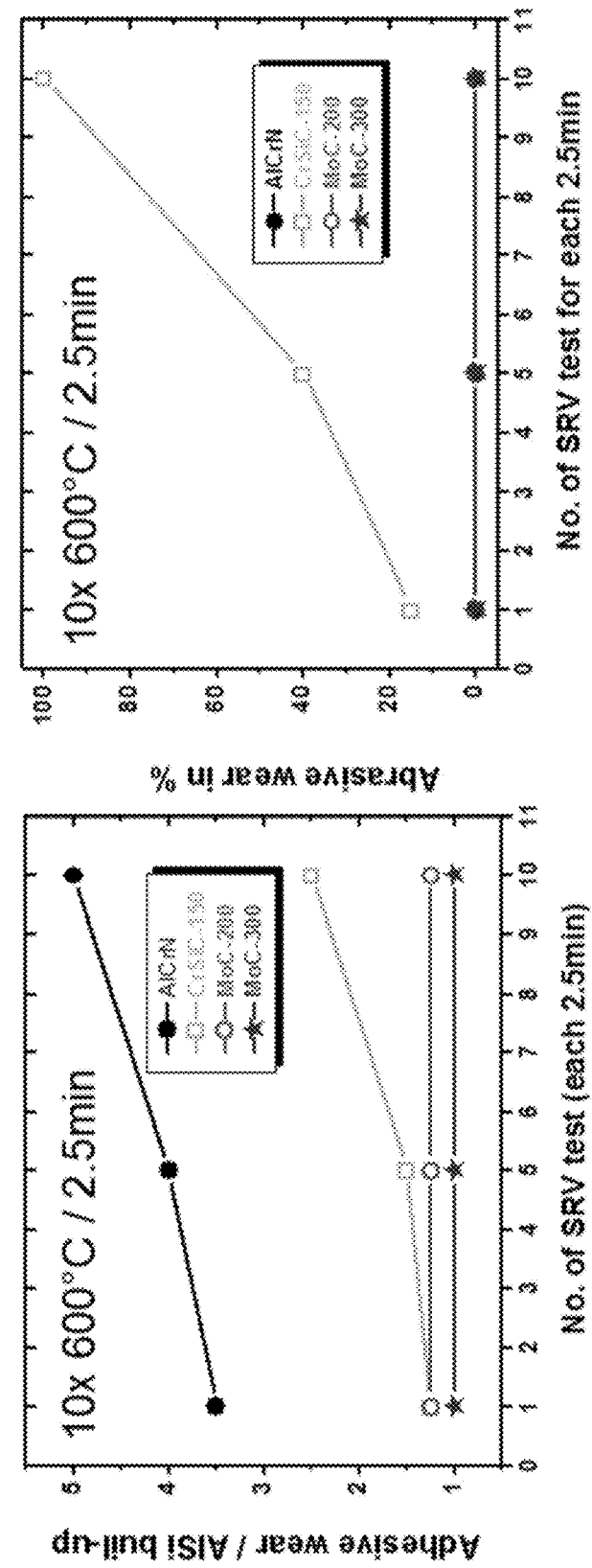
FIG. 26: Schematic illustration of the wear evolution (left: adhesive wear; right: abrasive wear) on the coating surface for the tribosystem coating vs. AlSi-based/22MnB5 as function of testing time at 600° C. The numbers in the coating notation indicate the C2H2 flow in sccm. See also FIG. 14.
Figure 27:
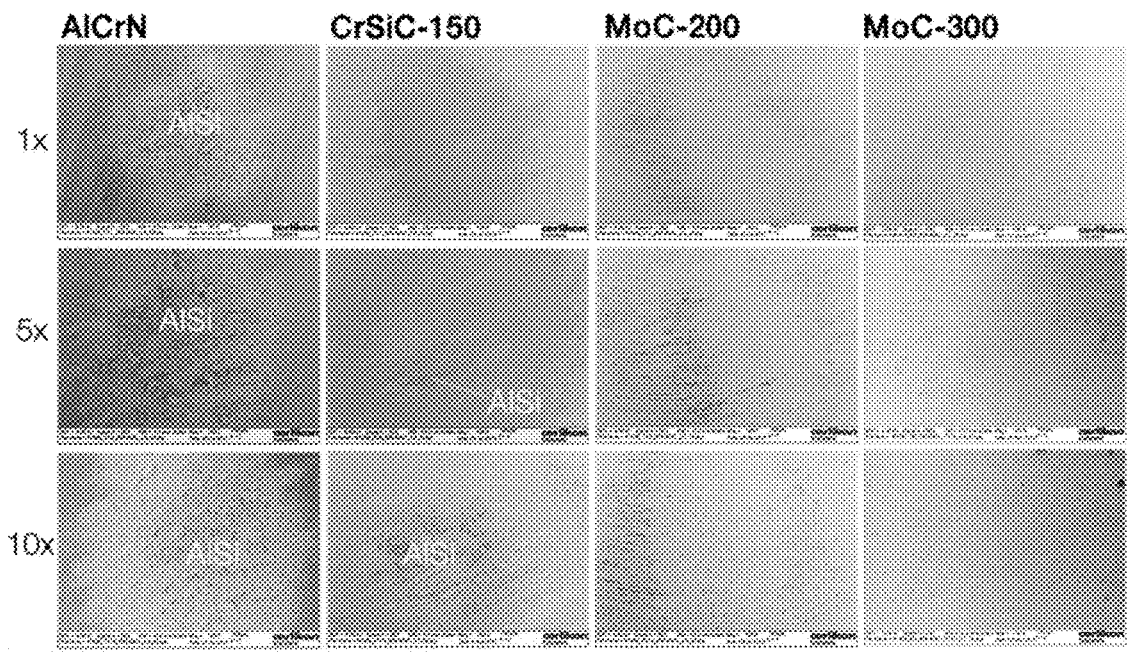
FIG. 27: SEM micrographs of the wear tracks on the coating surface for the tribosystem coating vs. AlSi-based/22MnB5 after HT-SRV testing for 2.5 min at 600° C. and for repeating the test up to 10 times in succession. Build-up material is AlSi-based. The numbers in the coating notation indicate the C2H2 flow in sccm. See also FIG. 14.

In FIG. 14 the results obtained for the tribosystem coating vs. AlSi-based/22MnB5 after HT-SRV testing for 2.5 min at 600° C. and for repeating the test up to 10 times in succession are shown. The schematic illustration of the coating wear evolution and the corresponding SEM wear track micrographs are shown in FIGS. 26 and 27, respectively. The benchmark coating AlCrN remained during "long-term" testing fully intact without abrasive wear, however, the adhesive wear (amount of AlSi build-up) increased significantly as clearly visible in FIG. 27. The Cr—Si—C coating with a C2H2 flow of 150 sccm (CrSiC-150) showed better adhesive wear evolution as compared to AlCrN, but due to the fact that abrasive wear was increasing with testing time, the amount of build-up increased as well once the functional layer was more and more gone. However, the superior performance of Mo—C coatings is demonstrated here again unambiguously. Both coatings Mo—C with 200 sccm C2H2 and with 300 sccm C2H2 (MoC-200 and MoC-300) stayed over testing time nearly free of AlSi build-up and, in particular, without occurrence of abrasive wear. The direct comparison among all tested coatings revealed clearly that MoC-300 had the best overall performance (see FIGS. 26 and 27), as adhesive and abrasive wear were fully absent during extended testing.

It has been shown above that increasing the C2H2 flow up to 300 sccm for Mo—C leads to best tribological performance at elevated temperatures. However, in this context it was also of particular significance to ensure that the promising coating systems are generally able to survive elevated temperatures in a long-term fashion (as required for industrial application). Moreover, as already mentioned in the beginning of this document, information about the coefficient of friction in direct contact to the coated sheets at elevated temperatures are also of great interest (in particular for Zn-coated sheets with respect to micro-cracking). For these reasons a comprehensive summary of relevant coating properties for the tribosystem coating vs. AlSi-based/22MnB5 is given in FIG. 15: Additionally to the HT-SRV performance, the abrasive wear coefficient at RT, the coating hardness, the coefficient of friction at RT against Al2O3 and at HT against the coated sheet and also the oxidation behavior are presented. The oxidation behavior was determined by measuring the oxide layer thickness (or the loss of coating thickness) in cross-sectional SEM after annealing the specimens to 600° C. for 1 hour in ambient atmosphere and thus it was possible to obtain the oxidation behavior in % normalized to a coating thickness of 8 rpm. The corresponding SEM wear track micrographs on the coatings are shown in FIG. 28.

The benchmark coatings AlCrN and TiAlN were free of oxidation and the COF against the AlSi/sheet is rather high with about 1.2. MoN has the same COF as AlCrN and TiAlN, but the coating is chemically not stable at these conditions, which means that the coating was fully oxidized. Nitrided-CL exhibits the highest COF against AlSi/sheet and the oxidation behavior of 30% is of rather intermediate nature.

In comparison to this the Mo—C coating with C2H2 flow of 200 sccm shows similar oxidation behavior of about 30% (as compared to the industrially applied nitrided-CL surface, which can be taken as a kind of industrial reference, i.e. it can be assumed that this level of oxidation is acceptable) and a reduced COF against AlSi/sheet with about 1.0. Moreover, it is very striking that Mo—C coatings with increased C2H2 flow up to 300 sccm showed on the one hand improved oxidation behavior (MoC-300 with about 15%) and on the other hand had a significantly reduced COF against AlSi/sheet with about 0.5. It has been recognized that one approach to increase the oxidation performance of pure Mo—C coatings with C2H2 flows of 200 sccm (and above) is to add Cr and Si to the coating architecture. The simultaneous operation of Mo and CrSi (95/5) targets in the mixed C2H2/argon atmosphere leads to the formation of finely nano-layered Mo—C/Cr—Si—C coatings 6 (see FIG. 30) with significantly improved oxidation performance (see results for MoCrSiC-200 and MoCrSiC-300 in FIG. 15). This can be explained by the fact that the Cr—Si—C coating with 150 sccm C2H2 flow exhibited very good oxidation resistance. However, in parallel to that, the abrasive wear performance is decreased for the nano-layered Mo—C/Cr—Si—C coatings which can be related to the poor abrasive wear behavior of Cr—Si—C coating with 150 sccm C2H2. Fortunately it was possible to adjust the architecture such that a reasonable overall compromise could be achieved (see MoC/MoCrSiC-200 in FIG. 15), i.e. high oxidation resistance with low adhesive and abrasive wear even though the COF against AlSi/sheet was with about 0.9 not as good as for pure MoC-300. This dedicated architecture can be described as a multilayer between pure Mo—C 5 (see FIG. 30) and nano-layered Mo—C/Cr—Si—C 6 (see FIG. 30) with pure Mo—C 5 (see FIG. 30) on top and with a constant C2H2 flow of 200 sccm throughout the different sublayers.

Figure 28:
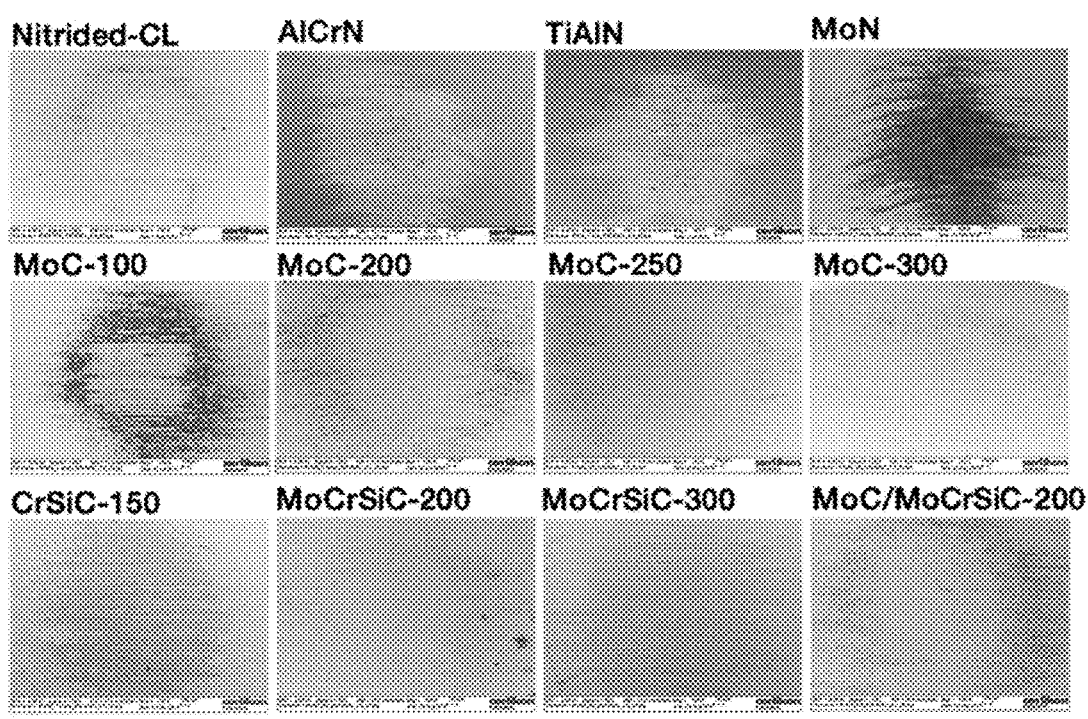
FIG. 28: SEM micrographs of the wear tracks on the coating surface for the tribosystem coating vs. AlSi-based/22MnB5 after HT-SRV testing for 2.5 min at 600° C. The effects of the addition of Carbon and "CrSi" to Mo—C with 200 sccm C2H2 and architectural design with respect to wear (in particular adhesive wear) are shown. Build-up material is AlSi-based. The numbers in the coating notation indicate the C2H2 flow in sccm. See also FIG. 15.

In FIG. 15 and in FIG. 28 it is also impressively shown for different Mo—C coatings how the AlSi build-up behavior correlates with the C2H2 flow. It follows that Mo—C coatings with C2H2 flow of 200 sccm and above are required in order to ensure a constantly low level of adhesive wear.

In FIG. 16 a comprehensive summary of relevant coating properties for the tribosystem coating vs. Zn-based/22MnB5 is shown: HT-SRV testing for 2.5 min and 10×2.5 min at 700° C., abrasive wear coefficient at RT, coating hardness, coefficient of friction at RT against Al2O3 and at HT against the coated sheet and also the oxidation behavior are presented.

Figure 29:
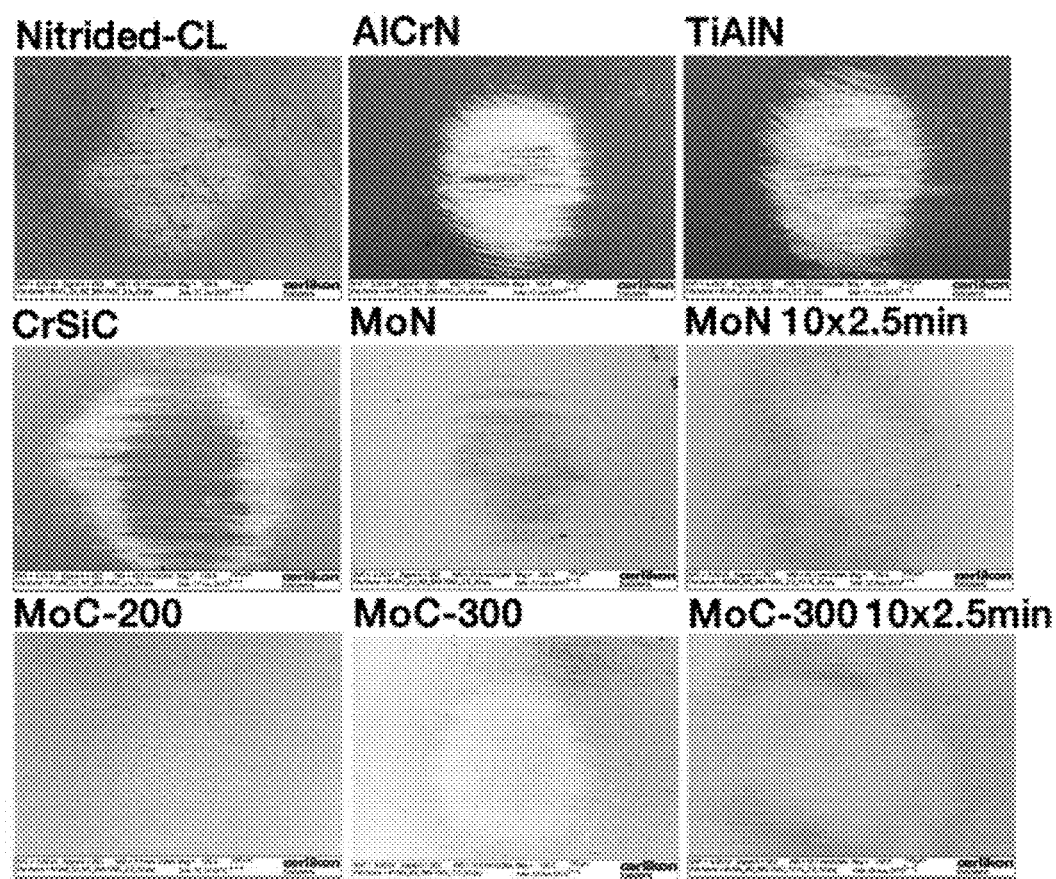
FIG. 29: SEM micrographs of the wear tracks on the coating surface for the tribosystem coating vs. Zn-based/22MnB5: HT-SRV testing for 2.5 min and 10×2.5 min at 700° C. See also FIG. 16.

The oxidation behavior was determined as already explained above and for this reason these results are not discussed again even though they are included for the sake of completeness in FIG. 16. The corresponding SEM wear track micrographs on the coatings are shown in FIG. 29. The benchmark coatings (nitrided-CL, AlCrN and TiAlN) showed after 2.5 min testing at 700° C. no abrasive wear, however, pronounced build-up of ZnO was visible. The COF against Zn/sheet was also for all three coatings relatively high with about 1.4. Upon "long-term" testing the nitrided-CL surface remained on a rather high level of adhesive wear and additionally to that abrasive wear became an issue (~15%). MoN showed basically a promising performance, i.e. no abrasive wear and low adhesive wear which was unchanged after "long-term" testing and COF against Zn/sheet was reduced to a value of about 1.0. However, the best overall performance was observed (as already reported for the tribosystem coating vs. AlSi/22MnB5) for the Mo—C coating with C2H2 flow of 300 sccm (MoC-300): No abrasive wear and very low adhesive wear which remained unchanged upon "long-term" testing. Furthermore, the COF against Zn/sheet was reduced significantly to a value of about 0.5.

Summarized, against the above background, it can be concluded that arc-evaporated Mo—C coatings with C2H2 flows of 300 sccm are exhibiting particular potential to be used as sound all-in-one solution for hot stamping of AlSi- and Zn-coated ultra-high strength steel sheets (e.g. 22MnB5) as all relevant coating properties like abrasive wear, adhesive wear, coefficient of friction and oxidation behavior are superior or at least equal as compared to the benchmark.

Arc-evaporated Mo—C coatings with C2H2 flows of 300 sccm have the following particular advantages:
- In contact with AlSi-coated metal sheets an extremely low adhesive wear was observed which provides particular potential to reduce significantly the severe galling phenomena during industrial operation.
- In contact with Zn-coated metal sheets a significantly reduced COF of about 0.5 was observed as compared with the benchmark which provides particular potential to improve the micro-cracking issue.

The invention claimed is:

1. A hot sheet metal forming process for manufacturing a work piece, comprising:
  forming a forming tool by depositing a hard coating that comprises at least one a-C:H:W coating layer onto a substrate by sputtering at least one WC-containing target in a carbon-containing atmosphere, and topping the at least one a-C:H:W layer with an a-C:H:W run-in layer deposited in a carbon-containing atmosphere with an increasing carbon content;
  using the forming tool to manufacture the work piece; and
  exposing the hard coating to temperatures above 500° C. during the forming process;
  wherein the work piece is an ultra-high strength metal sheet able to exhibit, after processing, a tensile strength of around 1500 MPa or more.

2. The hot sheet metal forming process according to claim 1, wherein the at least one a-C:H:W hard layer is deposited as an outermost layer.

3. The hot sheet metal forming process according to claim 1, wherein the at least one a-C:H:W hard layer is deposited as a functional layer.

4. The hot sheet metal forming process according to claim 1, further comprising at least one interlayer deposited between the substrate and the hard coating which improves adhesion of the hard coating to the substrate.

5. The hot sheet metal forming process according to claim 1, wherein the work piece is a metal sheet coated with a Zn coating or an AlSi coating.

6. The hot sheet metal forming process according to claim 1, wherein the work piece is a metal sheet of the type 22MnB5.

7. The hot sheet metal forming process according to claim 1, wherein the carbon-containing atmosphere is a mixed argon/acetylene atmosphere comprising more acetylene than argon.

8. The hot sheet metal forming process according to claim 1, wherein the at least one WC-containing target comprises about 6% Ni in atomic percentage.

9. The hot sheet metal forming process according to claim 1, comprising depositing the at least one a-C:H:W coating at a process temperature or substrate temperature lower than 150° C.

10. The hot sheet metal forming process according to claim 1, comprising using at least one pure chromium target for depositing a chromium interlayer as adhesion layer between the substrate and the at least one a-C:H:W layer.

11. The hot sheet metal forming process according to claim 1, comprising applying a bias voltage lower than 300 V during deposition of the at least one a-C:H:W layer.

* * * * *